United States Patent
Oohama

(10) Patent No.: US 7,633,758 B2
(45) Date of Patent: Dec. 15, 2009

(54) MODULE TYPE MULTIPHASE INVERTER

(75) Inventor: Kenichi Oohama, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 205 days.

(21) Appl. No.: 11/471,618

(22) Filed: Jun. 21, 2006

(65) Prior Publication Data

US 2007/0076355 A1    Apr. 5, 2007

(30) Foreign Application Priority Data

Jun. 22, 2005    (JP) ............................. 2005-181888

(51) Int. Cl.
*H05K 7/20*    (2006.01)
*H01L 23/34*    (2006.01)

(52) U.S. Cl. ...................... 361/717; 361/702; 361/709; 361/712; 257/713

(58) Field of Classification Search ................ 361/702, 361/709, 712, 717, 703; 257/713
See application file for complete search history.

(56) References Cited

U.S. PATENT DOCUMENTS

| | | | | |
|---|---|---|---|---|
| 5,623,399 A * | 4/1997 | Ishii et al. | | 363/132 |
| 6,495,913 B2 * | 12/2002 | Gruning | | 257/718 |
| 6,542,365 B2 | 4/2003 | Inoue | | |
| 6,618,278 B2 * | 9/2003 | Suzuki et al. | | 363/144 |
| 6,845,012 B2 | 1/2005 | Ohkouchi | | |
| 6,987,670 B2 * | 1/2006 | Ahmed et al. | | 361/699 |
| 7,200,007 B2 * | 4/2007 | Yasui et al. | | 361/716 |
| 2002/0180037 A1 * | 12/2002 | Shirakawa et al. | | 257/727 |
| 2003/0067749 A1 * | 4/2003 | Tamba et al. | | 361/699 |
| 2003/0142480 A1 * | 7/2003 | Spitz et al. | | 361/719 |
| 2004/0104446 A1 * | 6/2004 | Yoshizaki et al. | | 257/448 |
| 2004/0144996 A1 * | 7/2004 | Inoue | | 257/200 |
| 2004/0207968 A1 * | 10/2004 | Martin et al. | | 361/100 |
| 2005/0040515 A1 | 2/2005 | Inoue et al. | | |
| 2005/0162875 A1 * | 7/2005 | Rodriguez et al. | | 363/68 |
| 2006/0284308 A1 * | 12/2006 | Harada et al. | | 257/729 |
| 2007/0159864 A1 | 7/2007 | Yoshizaki et al. | | |

(Continued)

FOREIGN PATENT DOCUMENTS

JP    07-131978    5/1995

(Continued)

OTHER PUBLICATIONS

Office Action issued Oct. 16, 2008 in corresponding Japanese Application No. 2005-181888 and at least partial English language translation thereof.

*Primary Examiner*—Jayprakash N Gandhi
*Assistant Examiner*—Bradley H Thomas
(74) *Attorney, Agent, or Firm*—Nixon & Vanderhye P.C.

(57) ABSTRACT

A multiphase inverter has two card shaped arm modules facing each other along a stacking direction. Each module has semiconductor switching elements disposed along an element arranging direction substantially perpendicular to the stacking direction, a common heat sink plate connecting direct current electrodes of the elements with one of terminals of the power source, and phase heat sink plates connecting respective alternating current electrodes of the elements with respective multiphase terminals of a motor. The elements of each module correspond to all phases of an alternating current. Each common heat sink plate forms a principal surface of the corresponding module, and the phase heat sink plates of each module forms another principal surface. The principal surfaces of each module face each other along the stacking direction.

25 Claims, 12 Drawing Sheets

U.S. PATENT DOCUMENTS

2008/0164607 A1   7/2008   Harada et al.

FOREIGN PATENT DOCUMENTS

| | | |
|---|---|---|
| JP | 2001-308263 | 11/2001 |
| JP | 2004-040900 | 2/2004 |
| JP | 2005-045960 | 2/2005 |
| JP | 2005-073374 | 3/2005 |

\* cited by examiner

MODULE TYPE MULTIPHASE INVERTER

CROSS-REFERENCE TO RELATED APPLICATION

This application is based upon and claims the benefit of priority of the prior Japanese Patent Application 2005-181888 filed on Jun. 22, 2005 so that the contents of which are incorporated herein by reference.

BACKGROUND OF THE INVENTION

1. Field of the Invention

The present invention generally relates to a module type multiphase inverter such as a three-phase inverter which generates a multiphase alternating current from a direct current and controls the driving of a multiphase alternating current motor, for example, mounted on a vehicle.

2. Description of Related Art

The inventor of this specification has proposed a three-phase inverter having three half bridge modules in Published Japanese Patent First Publication No. H13-308263. In this publication, each module is formed in a card shape and has an upper arm element and a lower arm element corresponding to one of three phases. Each element is made of a semiconductor chip and has both a direct current (DC) terminal connected with a battery and an alternating current (AC) terminal connected with a motor. A three-phase inverter circuit is composed of the arm elements of the three modules.

In this inverter, the DC terminal of each element is made of an electrode plate which is exposed to the atmosphere to form one principal surface of the module on one side along a thickness direction of the module. The AC terminals of the upper and lower arm elements of each module are made of a common electrode plate which is exposed to the atmosphere to form the other principal surface of the module on the other side along the thickness direction. Therefore, the use of the common electrode plate can simplify the wiring arrangement. Further, because the electrode plates are placed on both surfaces of each card type module so as to be exposed to the atmosphere, heat generated in the module can be smoothly dissipated or radiated to the atmosphere through the plates. Accordingly, each module can have a both-surface cooling effect peculiar to the card type module.

However, in each module of the inverter, semiconductor chips of the upper arm element are disposed to be inverted to those of the lower arm element along the thickness direction. For example, each chip of the upper arm element has an emitter, a base and a collector in that order along the thickness direction, and each chip of the lower arm element has a collector, a base and an emitter in that order along the thickness direction. Therefore, packaging of the chips into the module is undesirably complicated.

To solve this problem, there is an idea that six arm elements of three phases are disposed together on a common substrate to pack the arm elements in full package in a card type module structure. However, in this inverter having the single card type module, because heat radiation from both principal surfaces of the module is required to obtain the both-surface cooling effect in the module, terminals of six or twelve chips (i.e., one or two chips for each arm element) are inevitably led out from side surfaces of the module, and wires for control signals and wires for power supply are extended toward the side surfaces of the module. Therefore, the leading of the terminals protruded from the side surfaces of the module and connection of the wires with the terminals are undesirably complicated. Further, because the wires are inevitably lengthened, surge noises caused by inductance of the wirings and power loss based on resistance of the wirings are undesirably increased.

Further, because all the arm elements are disposed on a single plate, this inverter inevitably has a large plane area. Therefore, when the inverter is packed into a motor of a vehicle, the installation of the motor in the vehicle is restricted. Moreover, the area of each principal surface of this module is increased, and size and weight of cooling members attached to the principal surfaces of the module are undesirable increased.

SUMMARY OF THE INVENTION

An object of the present invention is to provide, with due consideration to the drawbacks of the conventional three-phase inverter, a module type multiphase inverter which has arm elements compactly packed and is connectable with wires having a simplified arrangement while having a both-surface cooling effect peculiar to a card type module to efficiently radiate heat generated in the inverter.

According to a first aspect of this invention, the object is achieved by the provision of a multiphase inverter having both a first arm module and a second arm module. Each arm module is formed in a card shape. The first arm module has a plurality of first current converting elements, a first common heat sink plate and a plurality of first phase heat sink plates. The first current converting elements are disposed along a first direction. The first common heat sink plate connects a plurality of direct current electrodes of the first current converting elements with a higher voltage terminal of a power source and forms a principal surface of the first arm module. The first phase heat sink plates connect respective alternating current electrodes of the first elements with respective multiphase terminals of an alternating current motor, and forms another principal surface of the first arm module.

The second arm module has a plurality of second current converting elements, a second common heat sink plate and a plurality of second phase heat sink plates. The second current converting elements are disposed along the first direction. The second common heat sink plate connects a plurality of direct current electrodes of the second elements with a lower voltage terminal of the power source and forms a principal surface of the second arm module. The second phase heat sink plates connect respective alternating current electrodes of the second current converting elements with the respective multiphase terminals of the motor, and forms another principal surface of the second arm module.

In this configuration, the inverter is obtained by combining only two arm modules, and each arm module has the elements corresponding to all phases (of which the number is expressed by N). Accordingly, the manufacturing of the inverter can be considerably simplified as compared with a case where arm elements corresponding to a part of phases are assembled into each of three or more arm modules.

Further, as compared with a conventional case where each current converting element is connected with a power source through a bus bar, each common heat sink plate according to the present invention acts as a set of N bus bars. Accordingly, because only two common plates are required to electrically connect the elements of the arm modules with terminals of a power source, the use of the common heat sink plates can simplify the wiring for power supply.

Moreover, as compared with a conventional case where elements are connected with a power source through individual heat sink plates separated from one another via dead spaces, each common heat sink plate according to the present invention is equivalent to the combination of N heat sink plates having no dead space between them. Therefore, because an area composed of the N heat sink plates and opening spaces among them in the conventional case are used as an area of the common heat sink plate, an area of the common heat sink plate can be larger than a total area of the N heat sink plates. Accordingly, the common heat sink plate of each module can efficiently radiate heat generated in the elements of the module to the atmosphere, so that the use of the common heat sink plates can improve the heat radiation performance of the inverter.

Furthermore, as compared with a single module type inverter wherein all arm elements are mounted on a single heat sink plate, an area of a plane, on which the elements of each module are mounted, in the inverter according to the present invention can be reduced. Accordingly, the inverter according to the present invention can easily be installed into a motor housing, size and weight of a cooling unit for the inverter can be reduced, and connection of wires with terminals of the inverter can be simplified.

In conclusion, this inverter can have elements compactly packed and is connectable with wires having a simplified arrangement while having a both-surface cooling effect peculiar to a card type module.

DETAILED DESCRIPTION OF THE PREFERRED EMBODIMENTS

An embodiment of the present invention and its modifications will now be described with reference to the accompanying drawings. However, this embodiment and modifications should not be construed as limiting the present invention to those, and the structure of this invention may be combined with that based on the prior art.

Embodiment 1

Figure 1:
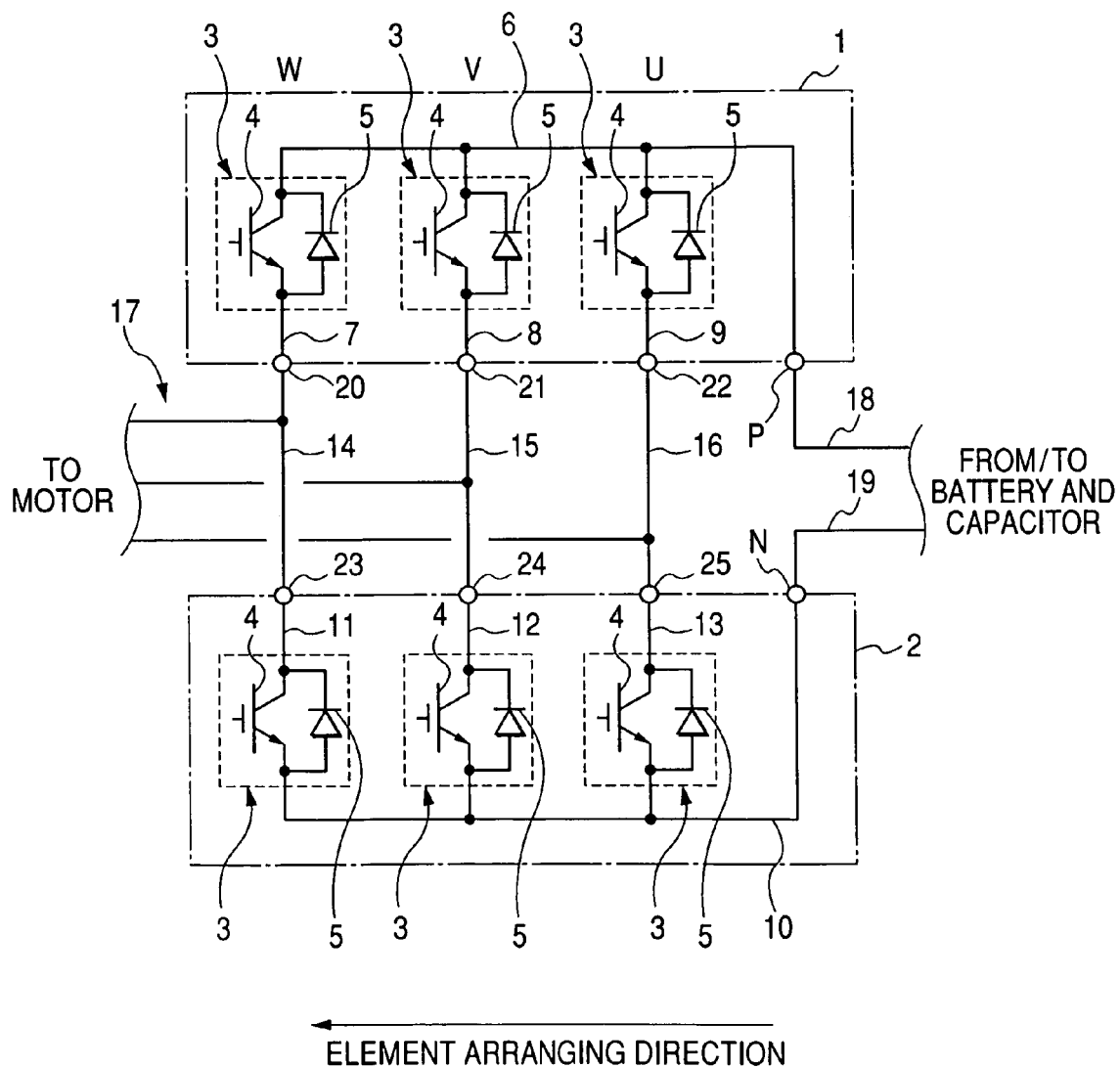
FIG. 1 is a view showing a circuit of a three-phase inverter representing a multiphase inverter according to an embodiment of the present invention.
Figure 2:
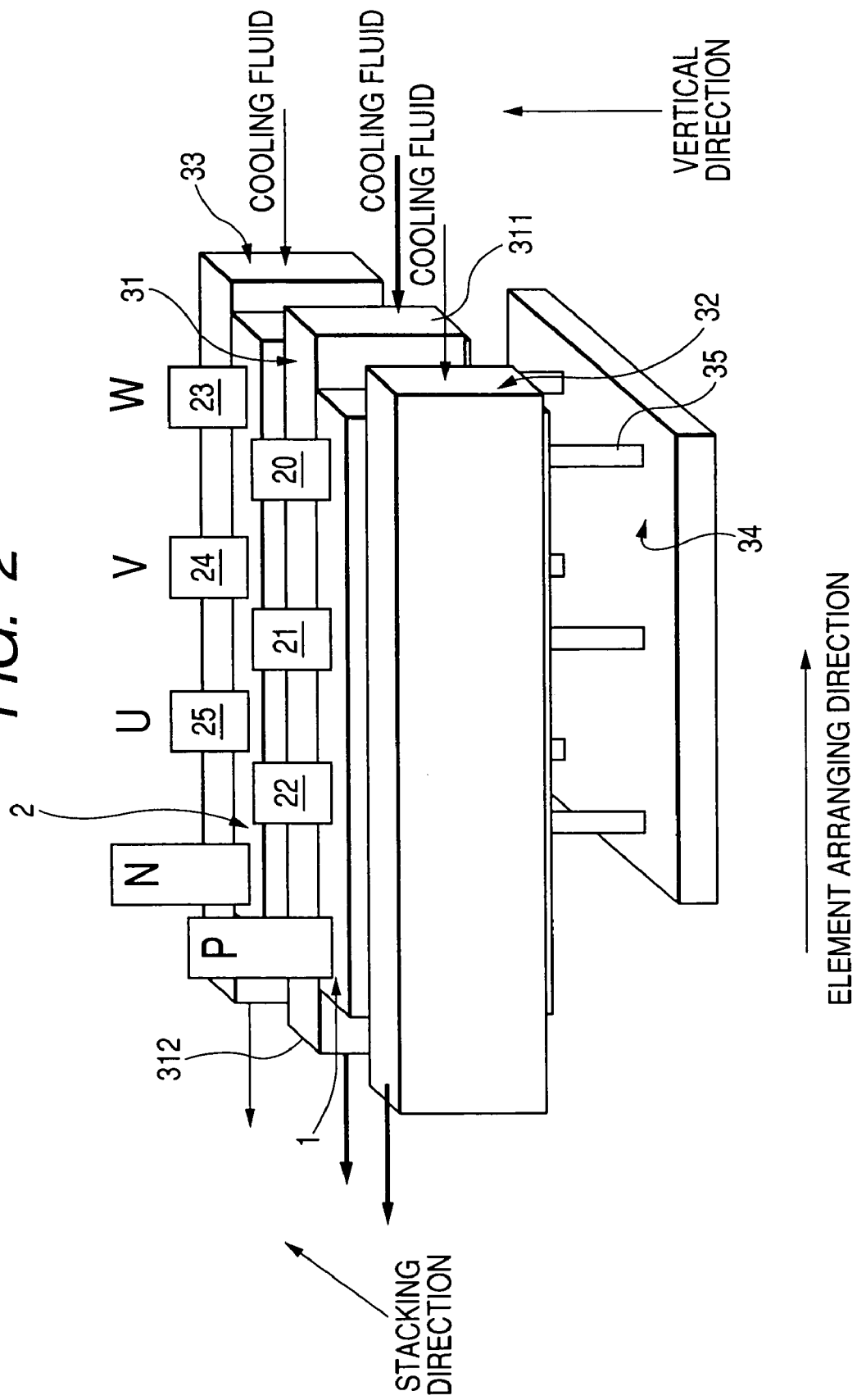
FIG. 2 is a perspective side view schematically showing the inverter shown in FIG. 1.

FIG. 1 is a view showing a circuit of a three-phase inverter representing a multiphase inverter according to the embodiment, and FIG. 2 is a perspective side view schematically showing the inverter shown in FIG. 1.

As shown in FIGS. 1 and 2, a three-phase inverter has a card shaped upper arm module 1 and a card shaped lower arm module 2. Each of the modules 1 and 2 has an arm element (or current converting element) 3 such as a semiconductor switching element for each of all phases U, V and W. The elements 3 of each module are disposed along an element arranging direction (or first direction) and generate a three phase alternating current from a direct current of a power source (not shown) in cooperation with the elements 3 of the other module. The modules 1 and 2 face each other along a stacking direction substantially perpendicular to the element arranging direction.

More specifically, the element (called U-phase element) 3 generating a U-phase current of the alternating current, the element (called V-phase element) 3 generating a V-phase current of the alternating current, and the element (called W-phase element) 3 generating a W-phase current of the alternating current are arranged in each module in that order along the element arranging direction.

The module 1 further has a common heat sink plate 6, a W-phase heat sink plate 7, a V-phase heat sink plate 8 and a U-phase heat sink plate 9. The plate 6 connects a direct current electrode of each element 3 of the module 1 with a higher voltage terminal P of the module 1. The plates 7 to 9 connect alternating current electrodes of the elements 3 with a W-phase connecting terminal 20, a V-phase connecting terminal 21 and a U-phase connecting terminal 22, respectively. Therefore, each of the plates 6 to 9 acts as an internal wire of the module 1. The plate 6 is exposed to the atmosphere to form a principal surface (or larger surface) of the module 1, and the plates 7 to 9 are exposed to the atmosphere to form three portions of another principal surface of the module 1 such that the principal surfaces face each other along the stacking direction. Therefore, the plates 6 to 9 act as heat radiators and efficiently radiate heat generated in the elements 3 to the atmosphere.

The module 2 further has a common heat sink plate 10, a W-phase heat sink plate 11, a V-phase heat sink plate 12 and a U-phase heat sink plate 13. The plate 10 connects direct current electrodes of the elements 3 of the module 2 with a lower voltage terminal N of the module 2. The plates 11 to 13 connect alternating current electrodes of the elements 3 with a W-phase connecting terminal 23, a V-phase connecting terminal 24 and a U-phase connecting terminal 25, respectively. Therefore, each of the plates 10 to 13 acts as an internal wire of the module 2. The plate 10 is exposed to the atmosphere to form a principal surface of the module 2, and the plates 11 to 13 are exposed to the atmosphere to form three portions of another principal surface of the module 2 such that the principal surfaces of the module 2 face each other along the stacking direction. Therefore, the plates 10 to 13 act as heat radiators and efficiently radiate heat generated in the elements 3 of the module 2.

The terminal P of the module 1 is connected with a direct current bus bar 18, and the terminal N of the module 2 is connected with a direct current bus bar 19. The bus bar 18 connects the plate 6 with a positive electrode of a battery (not shown) through the terminal P. The battery acts as a direct current power source. The bus bar 19 connects the plate 10 with a negative electrode of the battery through the terminal N. Preferably, a smoothing capacitor (not shown) is disposed such that a positive electrode of the capacitor is connected with the bus bar 18 and a negative electrode of the capacitor is connected with the bus bar 19. In this case, a voltage of a direct current supplied from the battery to the elements 3 can be reliably stabilized.

The inverter preferably has a W-phase current bus bar 14, a V-phase current bus bar 15 and a U-phase current bus bar 16. The bars 14, 15 and 16 connect the terminals 20 to 22 of the module 1 with the terminals 23 to 24 of the module 2, respectively. The bus bar 14 electrically connects the W-phase elements 3 of the modules 1 and 2 with an alternating current motor (not shown) through one of three phase lines of a three-phase cable 17. The bus bar 15 electrically connects the V-phase elements 3 of the modules 1 and 2 with the motor through another one of the phase lines of the cable 17. The bus bar 16 electrically connects the U-phase elements 3 of the modules 1 and 2 with the motor through the other one of the phase lines of the cable 17. Therefore, the U-phase elements 3 of the modules 1 and 2 are connected with the battery and motor through the plates 6, 10 and 16, the V-phase elements 3 of the modules 1 and 2 are connected with the battery and motor through the plates 6, 10 and 15, and the W-phase elements 3 of the modules 1 and 2 are connected with the battery and motor through the plates 6, 10 and 14.

Each element 3 may be composed of both an insulated-gate bipolar transistor (IGBT) chip 4 used as a power transistor and a flywheel diode chip 5 protecting the IGBT chip 4. In the module 1, a collector region of the chip 4 and a cathode region of the chip 5 in each element 3 are electrically connected with each other and form the direct current electrode of the element 3, and an emitter region of the chip 4 and an anode region of the chip 5 in each element 3 are electrically connected with each other and form the alternating current electrode of the element 3. In contrast, in the module 2, an emitter region of the chip 4 and an anode region of the chip 5 in each element 3 are electrically connected with each other and form the direct current electrode of the element 3, and a collector region of the chip 4 and a cathode region of the chip 5 in each element 3 are electrically connected with each other and form the alternating current electrode of the element 3.

In this embodiment, the three phase lines of the cable 17 may be directly connected with the connecting terminals 20 and 23, the connecting terminals 21 and 24 and the connecting terminals 22 and 25, respectively. The phase order of the elements 3 in the module 1 may differ from that of the elements 3 in the module 2.

As shown in FIG. 2, the inverter may further have an intermediate cooling member 31 disposed between the principal surfaces of the modules 1 and 2 facing each other through an insulating sheet (not shown), an upper arm cooling member 32 attached to the other principal surface of the module 1 through an insulating sheet (not shown), and a lower arm cooling member 33 attached to the other principal surface of the module 2 through an insulating sheet (not shown). Each of the modules 1 and 2 and the members 31 to 33 is formed in a rectangular parallelepiped extending along the element arranging direction. The modules 1 and 2 and the members 31 to 33 are layered or stacked along the stacking direction and are pressed by a pressing tool (not shown) to be formed in a unified body having a multi-layered structure.

The inverter may further have a control substrate 34 and a control signal bus bar 35 extending from each IGBT chip 4 of the modules 1 and 2 to the substrate 34. The substrate 34 is disposed on an end side along a vertical direction (or second direction) substantially perpendicular to the arranging direction and stacking direction and has an upper surface extending perpendicular to the vertical direction. The substrate 34 has a control circuit (see FIG. 10) on its upper surface for each phase, and the bus bars 35 of each phase are connected with the corresponding control circuit of the substrate 34.

The connecting terminals 20 to 25 and the terminals P and N are protruded from the modules 1 and 2 toward the other end side opposite to the side of the substrate 34 along the vertical direction. The terminals P and N are disposed on an end side along the arranging direction to be adjacent to the U-phase terminals 22 and 25 and to be furthest away from the W-phase terminals 20 and 23.

Each of the members 31 to 33 has an inlet 311 of cooling fluid at its end near the W-phase terminals 20 and 23 along the arranging direction, one or plurality of cooling fluid channels (not shown), and an outlet 312 of the cooling fluid at another end near the U-phase terminals 22 and 25 along the arranging direction. The cooling fluid entered from the inlet 311 flows through the channels straightly extending along the arranging direction and is outputted from the outlet 312. The cooling fluid is formed of cooling water including brine as an antifreezing mixture. However, any coolant such as cooling gas, liquid or mixture of liquid and gas may be used as the cooling fluid, and types of cooling fluid in the members 31 to 33 may differ from one another.

Although each member has a simple structure, the modules 1 and 2 can be equally cooled by the members 31 to 33. Further, because each member has a simple structure, the member can be easily manufactured. Moreover, because the cooling fluid flows through each straightly extending channel, fluid resistance for the cooling fluid can be reduced. Furthermore, because the members 32 and 33 are arranged on both sides along the stacking direction to form the inverter in the multi-layered structure, the inverter can be manufactured in a small size, and the members 31 to 33 can efficiently cool both principal surfaces of each module. Further, the members 32 and 33 can mechanically protect the modules. Moreover, because the inlets 311 and outlets 312 of the members 31 to 33 are placed on both sides along the arranging direction, the modules and the members can be stacked along the stacking direction. Because the modules and the members can be strongly stacked, thermal resistance between the member and module can be preferably reduced.

Figure 3:
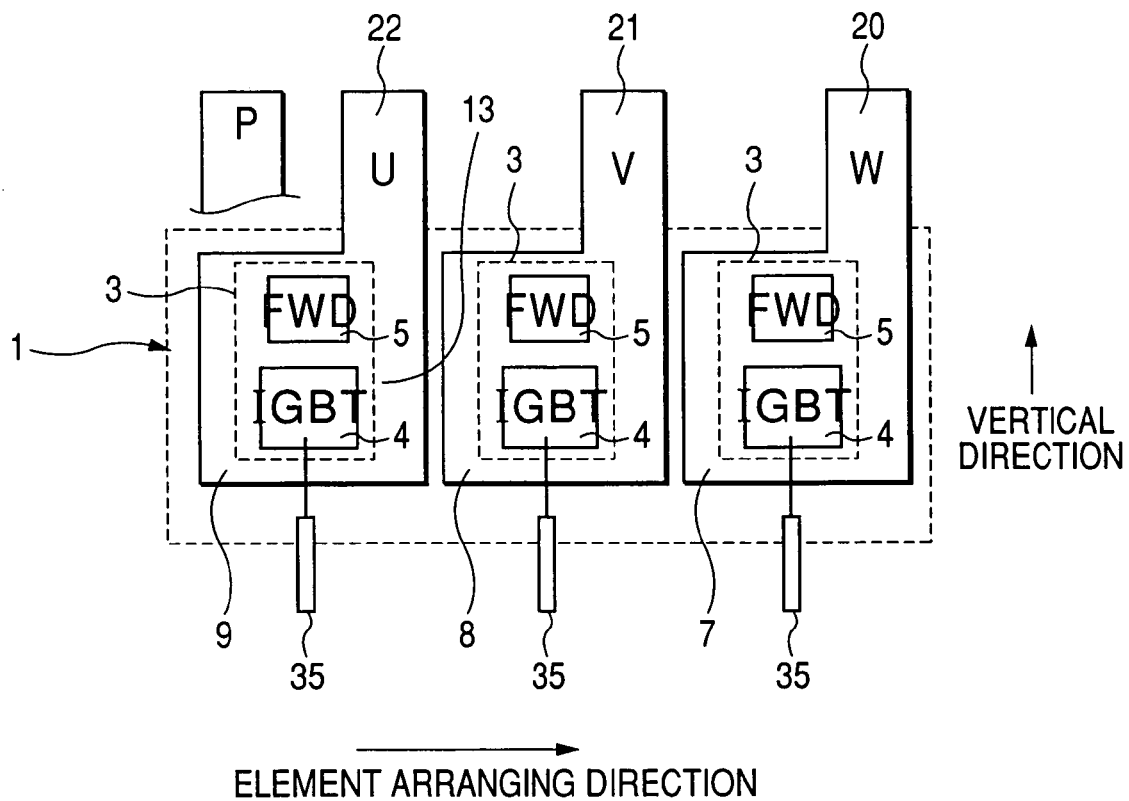
FIG. 3 is a side view of an upper arm module seen from a lower arm module and schematically shows arrangement of chips.

FIG. 3 is a side view of the module 1 seen from the module 2 and schematically shows arrangement of the chips 4 and 5. The module 2 seen from the module 1 is substantially the same as that shown in FIG. 3, so that a side view of the module 2 is omitted.

As shown in FIG. 3, the connecting terminals 20 to 22 are integrally formed with the plates 7 to 9 and are protruded from the module 1 toward the upper side opposite to the side of the substrate 34 along the vertical direction, respectively. The chips 4 and 5 of each element 3 are disposed adjacent to each other at a predetermined interval along the vertical direction on the corresponding plate 7, 8 or 9 and are placed at the same position along the arranging direction. The IGBT chips 4 of the module 1 are placed at the same position along the vertical direction and are placed to be far away from the terminals 20 to 22 along the vertical direction. The diode chips 5 of the module 1 are placed at the same position along the vertical direction and are placed to be near the terminals 20 to 22 along the vertical direction. The terminal P is integrally formed with the plate 6 and is protruded from the module 1 in the same manner as the terminals 20 to 22. The bus bars 35 are, respectively, connected with base regions of the IGBT chips 4 through bonding wires and are protruded toward the lower direction opposite to the vertical direction.

Because each chip 4 is placed opposite to the terminals along the vertical direction, the signal bus bar 35 extending from the chip 4 can be easily led out from the module to the substrate 34. Further, because the bus bars 35 are protruded from the module 1 along the direction opposite to that of the terminals 20 to 22 and P, interference between the group of bus bars 35 and the group of lines of the cable 17 and the bus bars 18 and 19 can be prevented, and the bus bars and lines can be wired in a simplified arrangement.

The chips 4 and 5 and the terminals 23 to 25 and N in the module 2 are disposed in the same manner as those in the module 1.

Figure 4:
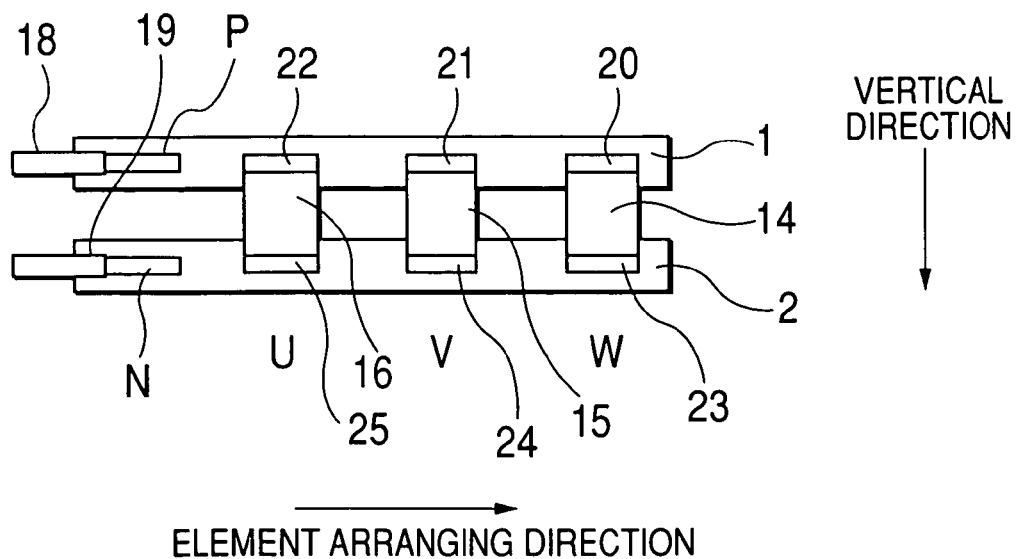
FIG. 4 is a top view of the modules and schematically shows connection of terminals of the modules with bus bars.

FIG. 4 is a top view of the modules 1 and 2 and schematically shows connection of terminals of the modules with bus bars. The modules 1 and 2 are disposed to be placed at the same area as each other when the modules 1 and 2 are seen along the stacking direction. Each pair of connecting terminals of the same phase among the terminals 20 to 25 are placed at the same position as each other along the arranging direction. The terminals 20 to 22 of the module 1 are placed at the same position along the stacking direction, and the terminals 23 to 25 of the module 2 are placed at the same position along the stacking direction. Ends of the bus bars 14 to 16 are, respectively, connected with the terminals 20 and 23, the terminals 21 and 24 and the terminals 22 and 25 and are placed at the same position when being seen along the stacking direction. The other ends (not shown) of the bus bars 14 to 16 are connected with the cable 17. The terminal P protruded from the plate 6 is attached to the bus bar 18, and the terminal N protruded from the plate 10 is attached to the bus bar 19. The terminals P and N are placed at the same position as each other along the arranging direction. The terminals P and N are placed on one side along the arranging direction so as to be far away from the terminals 20 to 25.

The terminals 20, 21 and 22 may be directly connected with the terminals 23, 24 and 25, respectively, without arranging the bus bars 14 to 16. In this case, the lines of the cable 17 are directly connected with the terminals 20 and 23, the terminals 21 and 24 and the terminals 22 and 25, respectively.

Because the terminals P and N are placed at the same position as each other along the arranging direction, wires connecting the terminals and the battery can be shortened. Accordingly, electric power of the battery can be supplied to the elements 3 while reducing surge noises and wiring resistance. Further, because the terminals P and N are protruded from the modules 1 and 2 along the same direction as that of the terminals 20 to 25, the inverter can be manufactured in a small size. Moreover, because the terminals P and N are placed to be far away from the terminals 20 to 25, interference between the group of phase lines of the cable 17 and the group of bus bars 18 and 19 can be reduced.

Figure 5:
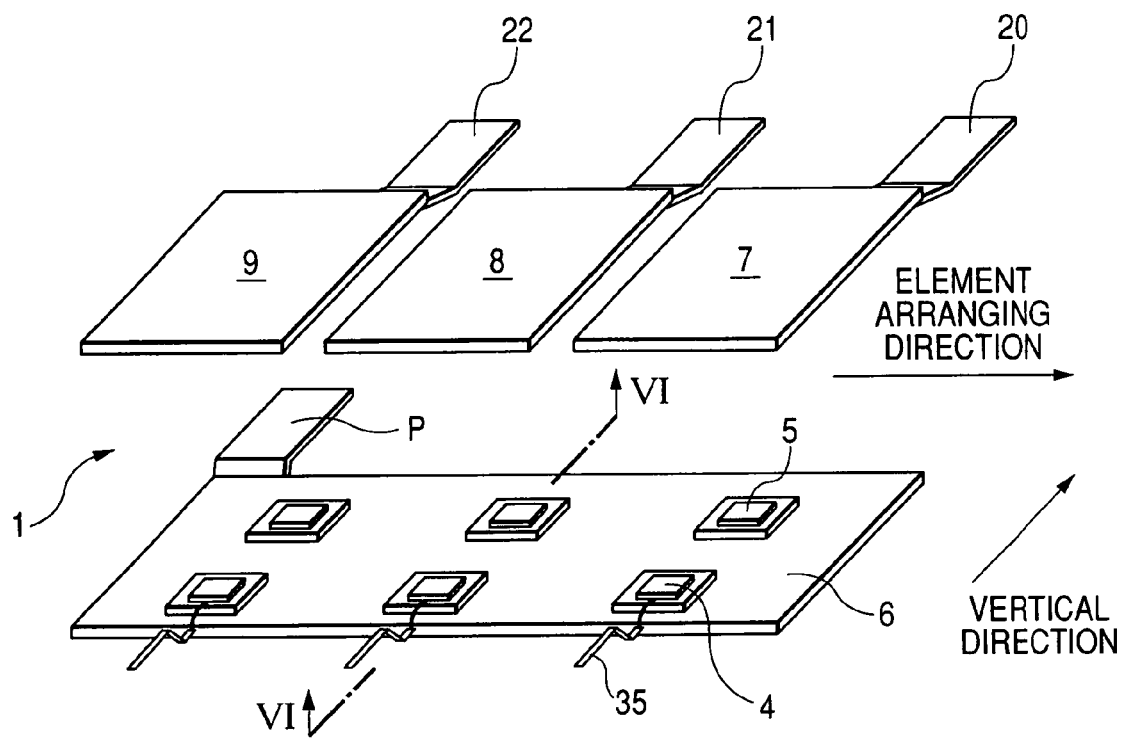
FIG. 5 is an exploded view of the upper arm module.
Figure 6:
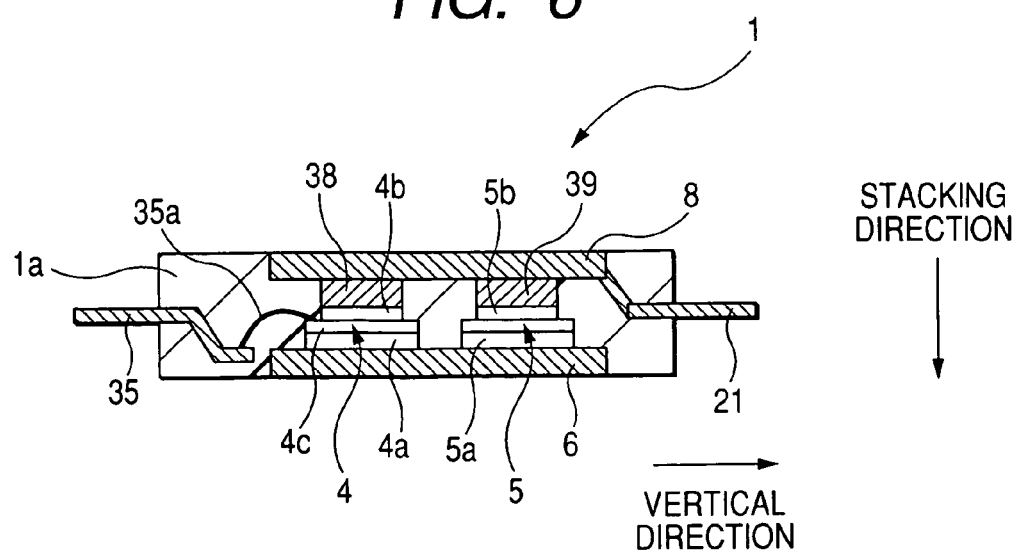
FIG. 6 is a longitudinal sectional view taken substantially along line VI-VI of FIG. 5.
Figure 7:
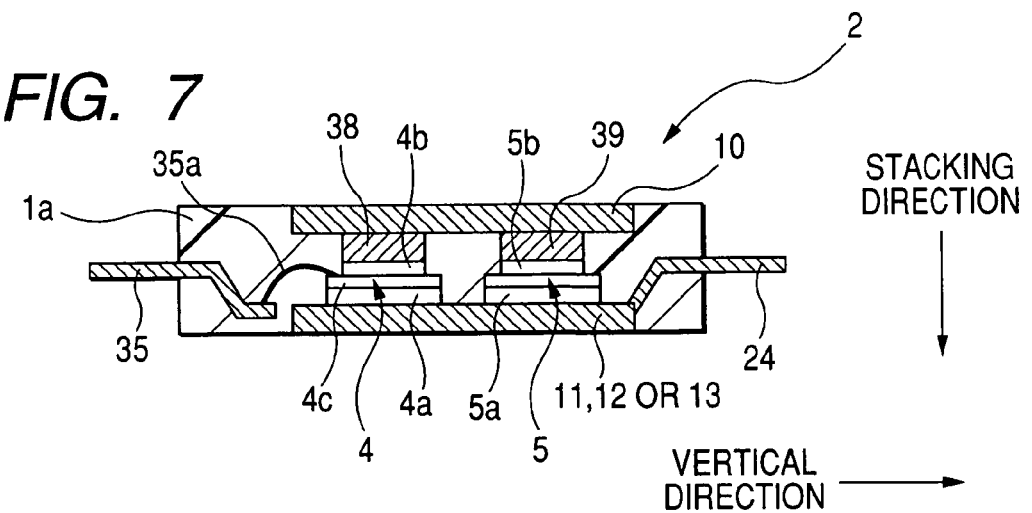
FIG. 7 is a longitudinal sectional view of the lower arm module and shows a V-phase region in the same manner as that shown in FIG. 6.

FIG. 5 is an exploded view of the module 1, FIG. 6 is a longitudinal sectional view taken substantially along line VI-VI of FIG. 5, and FIG. 7 is a longitudinal sectional view of the module 2 and shows a V-phase region in the same manner as that shown in FIG. 6.

As shown in FIG. 5, three pairs of chips 4 and 5 are disposed at first predetermined intervals along the arranging direction, and the terminals 20 to 22 are disposed at the predetermined intervals. As shown in FIGS. 5 and 6, a collector region 4a of each chip 4 and a cathode region 5a of each chip 5 are directly fixed to the plate 6, and an emitter region 4b formed in an upper area of each chip 4 and an anode region 5b formed in an upper area of each chip 5 are attached to the corresponding plate 7, 8 or 9 through intervening electrical conductors 38 and 39, respectively. Preferably, the chips 4 and 5 are attached to the plates 7 to 9 after fixing the chips 4 and 5 to the plate 6. As shown in FIG. 6, a base region 4c of each chip 4 is connected with the corresponding bus bar 35 through a bonding wire 35a. The module 1 is molded with resin 1a so as to expose both principal surfaces of the module 1 to the atmosphere. The conductors 38 and 39 are disposed to secure an area for arranging the bonding wire 35a.

As shown in FIG. 7, the arrangement in the module 2 differs from that in the module 1 in that a collector region 4a of each chip 4 and a cathode region 5a of each chip 5 are directly fixed to the corresponding plate 11, 12 or 13 and both an emitter region 4b of each chip 4 and an anode region 5b of each chip 5 are attached to the plate 10 through intervening electrical conductors 38 and 39, respectively. Preferably, the chips 4 and 5 are attached to the plate 10 after fixing the chips 4 and 5 to the plates 11 to 13.

Figure 8:
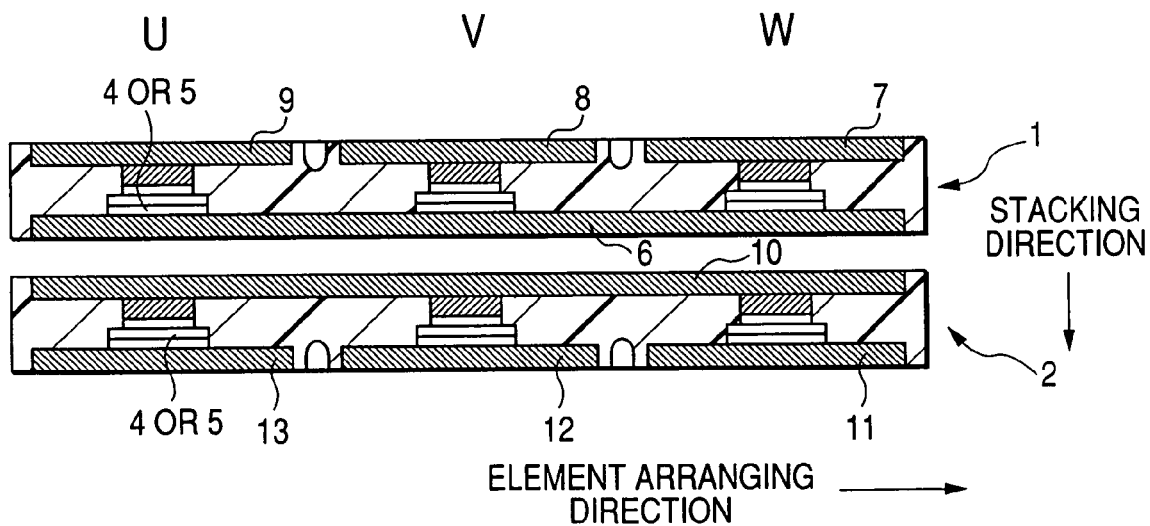
FIG. 8 is a transverse sectional view of the modules taken along a plane substantially perpendicular to a vertical direction.

FIG. 8 is a transverse sectional view of the modules 1 and 2 taken along a plane substantially perpendicular to the vertical direction. As shown in FIG. 8, the modules 1 and 2 are placed at a second predetermined interval along the stacking direction such that the plates 6 and 10 of the modules 1 and 2 face each other. However, the modules 1 and 2 may be placed such that one of the plate 6 and the group of plates 7 to 9 faces one of the plate 10 and the group of plates 11 to 13.

In this embodiment, the modules 1 and 2 face each other so as to place the elements 3 of each phase at the same position along the arranging direction. However, the modules 1 and 2 may substantially face each other such that the positions of the elements 3 of each phase along the arranging direction differ from each other within an upper limit distance which is smaller than the first predetermined interval of the elements 3 of the same module along the arranging direction. In this case, the terminals of each phase can be easily connected with each other through the bus bar.

Figure 9:
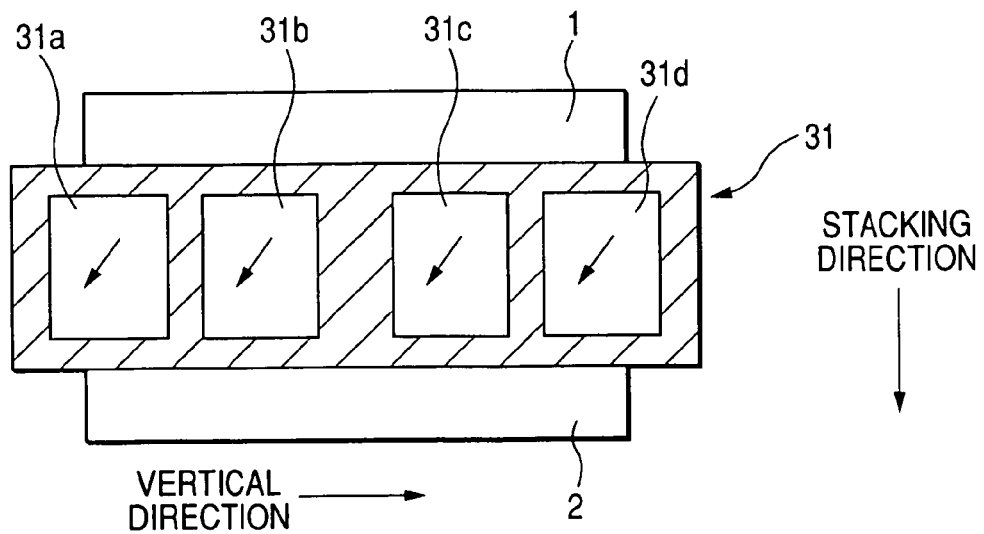
FIG. 9 is a longitudinal sectional view of an intermediate cooling member taken along a plane substantially perpendicular to the arranging direction.

FIG. 9 is a longitudinal sectional view of the intermediate cooling member 31 taken along a plane substantially perpendicular to the arranging direction. The member 31 is formed by drawing and molding an aluminum thick plate so as to have a plurality of cooling fluid channels 31a to 31d extending along the arranging direction in parallel to one another therein. Therefore, the cooling fluid straightly flows through each channel from the inlet 311 to the outlet 312 shown in FIG. 2 and receives heat of the W-phase elements 3, heat of the V-phase elements 3 and heat of the U-phase elements 3 in that order. The members 32 and 33 have the same configuration as that of the member 31.

Figure 10:
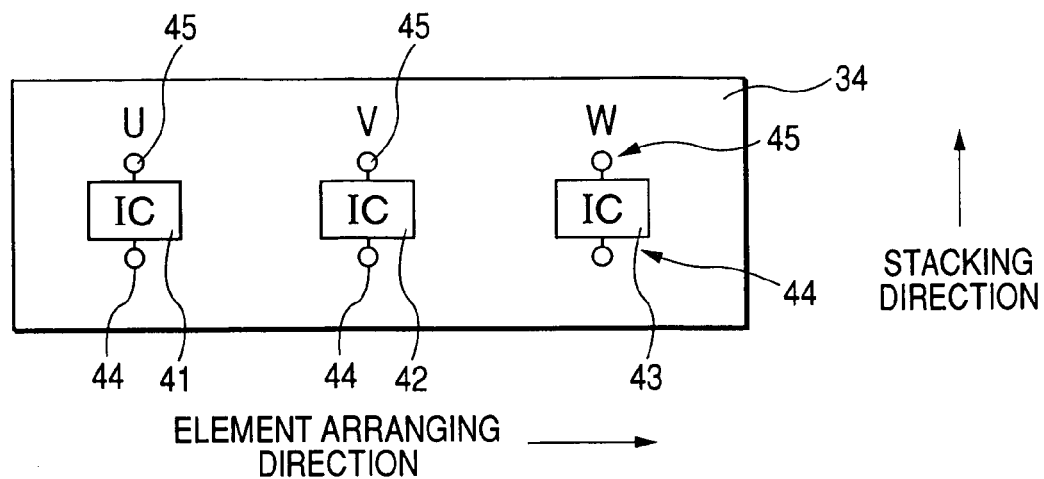
FIG. 10 is a plan view of a control substrate.

FIG. 10 is a plan view of the control substrate 34. The substrate 34 has a U-phase control integrated circuit (IC) 41, a V-phase control IC 42 and a W-phase control IC 43 disposed at predetermined intervals in that order along the arranging direction so as to be electrically isolated from one another. Each IC has two connecting terminals 44 and 45 on both end sides along the stacking direction. The bus bar 35 connected with the IGBT chip 4 of the module 1 is connected with the terminal 44 for each phase, and the bus bar 35 connected with the IGBT chip 4 of the module 2 is connected with the terminal 45 for each phase. Preferably, the terminals 44 are placed just below the IGBT chips 4 of the module 1, and the terminals 45 are placed just below the IGBT chips 4 of the module 2.

The ICs 41 to 43, respectively, transmit upper arm control signals to the base regions of the IGBT chips 4 of the module 1 through the terminals 44 and the bus bars 35 and, respectively, transmit lower arm control signals to the base regions of the IGBT chips 4 of the module 2 through the terminals 45 and the bus bars 35. Because the control signals are outputted from the end sides of the ICs 41 to 43 electrically isolated from one another, interference of the signals with one another can be reliably reduced. In response to the control signals, the U-phase elements 3, the V-phase elements 3 and the W-phase elements 3 of the modules 1 and 2 generate a U-phase current, a V-phase current and a W-phase current from a direct current of the battery, respectively. A three phase alternating current composed of the three phase currents is transmitted to the motor through the bus bars 14 to 16 and the cable 17 to drive the motor.

The ICs 41 to 43 may be formed of a single IC while electrically isolating terminals for control signals from one another. Further, both an IC outputting three control signals to the IGBT chips 4 of the module 1 and another IC outputting three control signals to the IGBT chips 4 of the module 2 may be disposed on the substrate 34 in place of the ICs 41 to 43.

As described above with reference to FIGS. 1 to 10, the inverter is obtained by combining only two modules 1 and 2, and each module has the elements 3 corresponding to all three phases. Further, orientation of the chips 4 and 5 in each module are the same as one another. Accordingly, as compared with a case where arm elements corresponding to a part of phases are assembled into each of three or more arm modules, the elements 3 can be compactly disposed in the inverter, and the manufacturing of the inverter can be considerably simplified.

Further, as compared with an imaginary case where each element of the modules is connected with the power source through a bus bar, each common heat sink plate acts as three bus bars. Accordingly, because only two common plates 6 and 10 are required to electrically connect the elements 3 of the modules 1 and 2 with the battery, the use of the common heat sink plates 1 and 2 can simplify the wiring for power supply.

Moreover, as compared with an imaginary case where elements 3 are connected with the power source through individual heat sink plates separated from one another via dead spaces, each common heat sink plate 6 or 10 is equivalent to the combination of three heat sink plates having no dead space between them. Therefore, because an area composed of the separated heat sink plates and opening spaces between them are used as an area of the common heat sink plate, an area of the common heat sink plate can be set to be larger than a total area of the separated heat sink plates. Accordingly, the common heat sink plates can efficiently radiate heat generated in the modules to the atmosphere, so that the use of the common heat sink plates can improve the heat radiation performance of the inverter.

Furthermore, as compared with a single module type inverter wherein all elements are mounted on a single heat sink plate, an area of a plane, on which the elements of each module are mounted, can be reduced in the inverter according to this embodiment. Accordingly, the inverter can be easily installed into a motor housing, size and weight of a cooling unit for the inverter can be reduced, and connection of wires with terminals of the inverter can be simplified.

Still further, the cooling members 31 to 33 are disposed separately from the modules 1 and 2. Therefore, when at least one module is replaced with a new module for repair, it is not required to separate the cooling system from the members 31 to 33. Accordingly, fluid leaking caused by detaching the pipes of the cooling system from the members can be prevented. Further, because the inlet 311 and outlet 312 are disposed on end sides of each member along the arranging direction, the cooling fluid can flow through each member at a low flow resistance, and the bus bars 18 to 25 connected with the modules 1 and 2 can be smoothly separated from the pipes of the cooling system and the members 31 to 33 so as to simplify the arrangement of the bus bars and pipes.

Still further, the phase order in the module 1 is set to be the same as that in the module 2 along the arranging direction. Accordingly, the arrangement of the terminals 14 to 16 can be simplified, and the terminals 14 to 16 can be shortened.

Still further, the terminals 20 to 25 and the terminals P and N are protruded from the modules 1 and 2 toward the same direction. Accordingly, the terminals can reliably be away from one another, so that interference among the terminals can be prevented. Further, because the terminals of each phase are placed at the same position along the arranging direction, the connection of the terminals with the bus bar can be facilitated.

In this embodiment, the elements 3 of the modules 1 and 2 generate a three phase alternating current from a direct current. However, the elements 3 may generate a direct current from a three phase alternating current.

Modification 1 of the Embodiment

Figure 11:
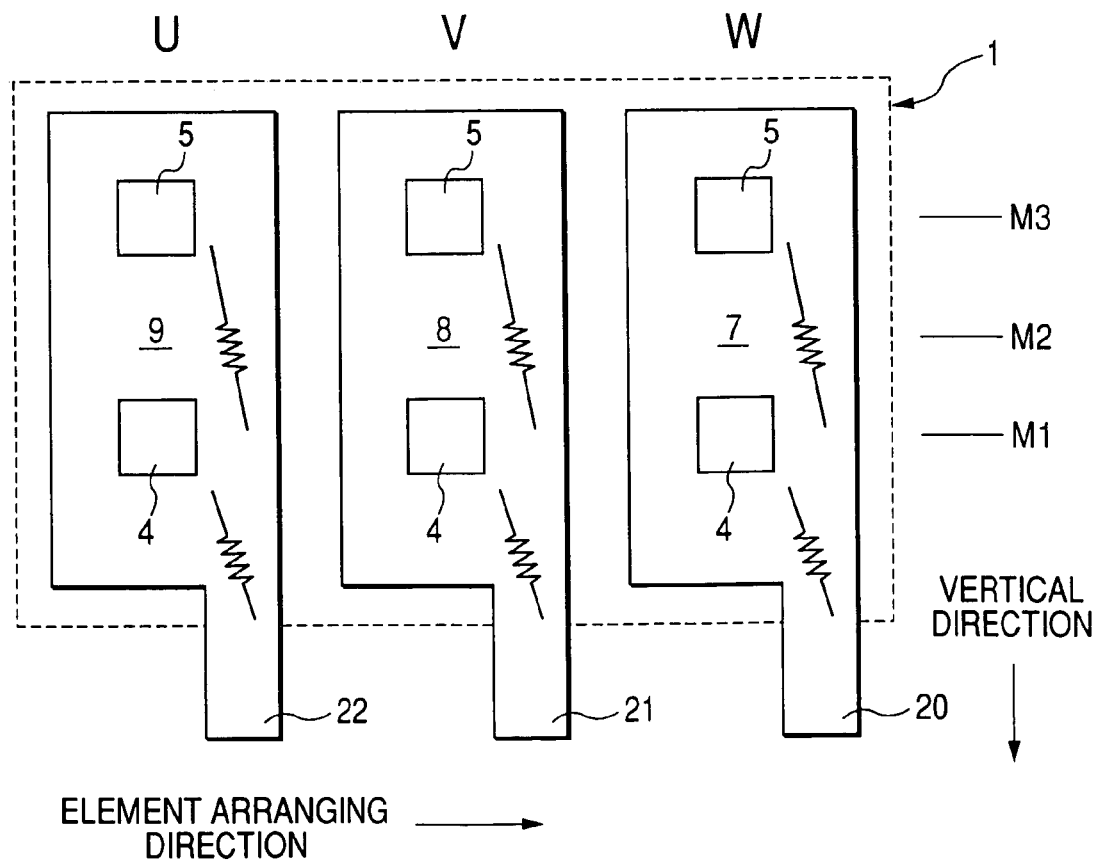
FIG. 11 is a side view schematically showing the upper arm module seen from the lower arm module according to a first modification of the embodiment.

FIG. 11 is a side view schematically showing the module 1 seen from the module 2 according to a first modification. As shown in FIG. 11, the IGBT chip 4 corresponding to each phase in the module 1 may be disposed to be nearer to the terminal 20, 21 or 22 than the chip 5 of the phase. In this case, the chip 4 of each phase also becomes nearer to the terminal P than the chip 5 of the phase Each of the plates 6 to 9 has an electrical resistance (hereinafter, called wiring resistance) for a current flowing through each of the chips 4 and 5, and heat is inevitably generated in the plates 6 to 9 by the currents of the chips 4 to 5 according to the wiring resistances of the plates. The wiring resistance of each plate for a current depends on a path length of the current in the plate. Further, a value of current flowing through the chip 4 of each phase is generally larger than that flowing though the chip 5 of the phase. When the chips 5 are disposed to be nearer to the terminals 20 to 22 and P than the chips 4 (see FIG. 5), wiring resistances of the plates 6 to 9 for the chips 4 become large. Therefore, an amount of heat generated by the current of each chip 4 becomes large, and there is a possibility that a three phase alternating current supplied to the motor is reduced and a large quantity of heat is generated in the plates 6 to 9.

To reduce heat generated in each plate, it is preferred that a wiring resistance of the phase plate 7, 8 or 9 and a wiring resistance of the common plate 6 for a current flowing through each chip 4 are made smaller than that for a current flowing through the chip 5. In this modification, because the chips 4 are disposed near to the terminals 20 to 22 and the terminal P, wiring resistances of the phase plates 7 to 9 and the common plate 6 for the currents of the chips 4 can be lowered. Accordingly, a three phase alternating current having a sufficient value can be supplied to the motor, and heat generated in the plates can be reduced so as to be smoothly dissipated to the atmosphere.

Further, a distance between a center position M1 of each chip 4 and a center position M2 of the corresponding plate along the vertical direction may be set to be smaller than a distance between a center position M3 of the corresponding chip 5 and the center position M2 along the vertical direction. In this case, an area of the plate receiving and radiating heat generated by the current of each chip 4 becomes larger than that for the corresponding chip 5. Therefore, as compared with a case where a distance between the positions M1 and M2 is the same as a distance between the positions M2 and M3, heat generated in the plates 6 to 9 by the currents of the chips 4 and 5 can be made small and be effectively radiated to the atmosphere, and increase of temperature of each plate can be effectively reduced.

The chips 4 and 5 may be arranged in the module 2 in the same manner as in the module 1.

Modification 2

Figure 12:
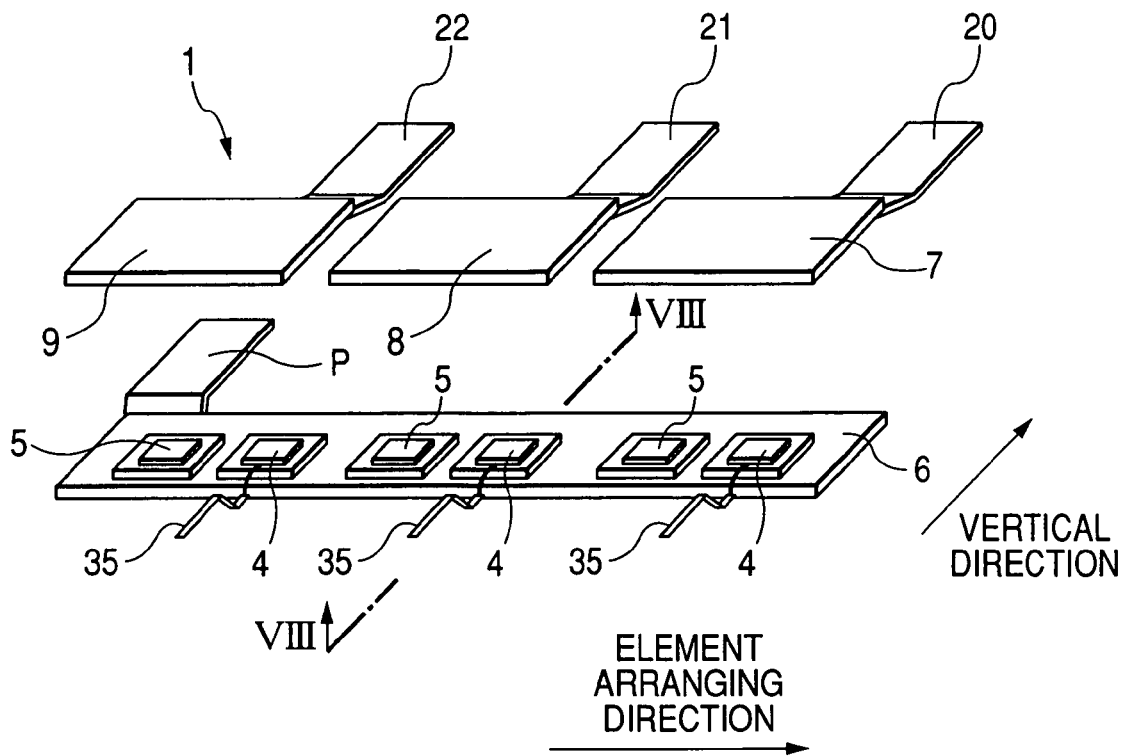
FIG. 12 is an exploded view of the upper arm module according to a second modification.
Figure 13:
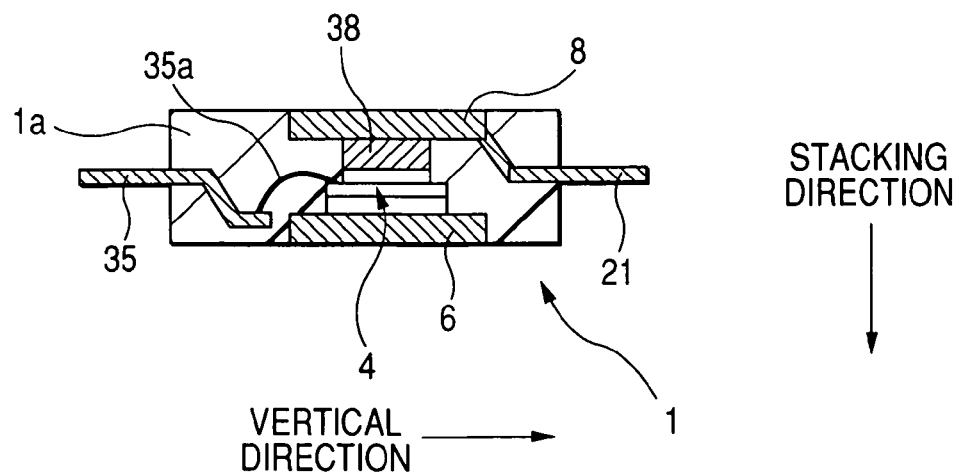
FIG. 13 is a longitudinal sectional view taken substantially along line XIII-XIII of FIG. 12.

FIG. 12 is an exploded view of the module 1 according to a second modification, and FIG. 13 is a longitudinal sectional view taken substantially along line XIII-XIII of FIG. 12. As shown in FIGS. 12 and 13, the chips 4 and 5 of each element 3 are disposed adjacent to each other along the arranging direction such that the chips 4 and 5 of the module 1 are aligned with one another along the arranging direction, and the chips 4 are placed to be nearer to the terminals 20 to 22 than the chips 5, respectively. In the same manner, the chips 4 and 5 may be arranged in the module 2.

Accordingly, as compared with a case where the chips 4 and 5 of each element 3 are disposed adjacent to each other along the vertical direction (see FIG. 5), the length of the inverter along the vertical direction can be shortened. In other words, an aspect ratio of the modules can be lowered, so that the inverter can be easily disposed in a narrow space of the motor.

As another modification, when the chips 5 of the modules 1 and 2 are, respectively, shifted a little bit toward the connecting terminals, heat interference between the chips 4 and 5 in each pair can be preferably reduced.

Figure 14:
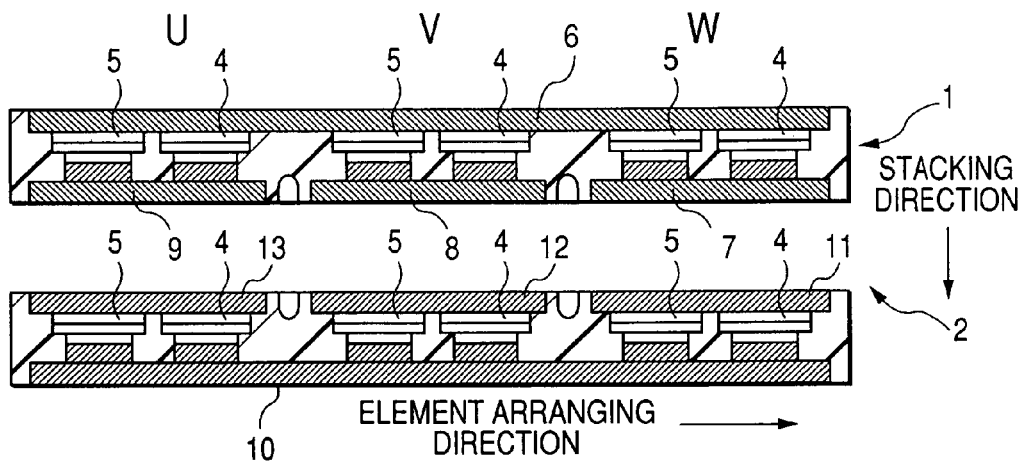
FIG. 14 is a transverse sectional view of the modules taken along a plane substantially perpendicular to a vertical direction according to the second modification.
Figure 15:
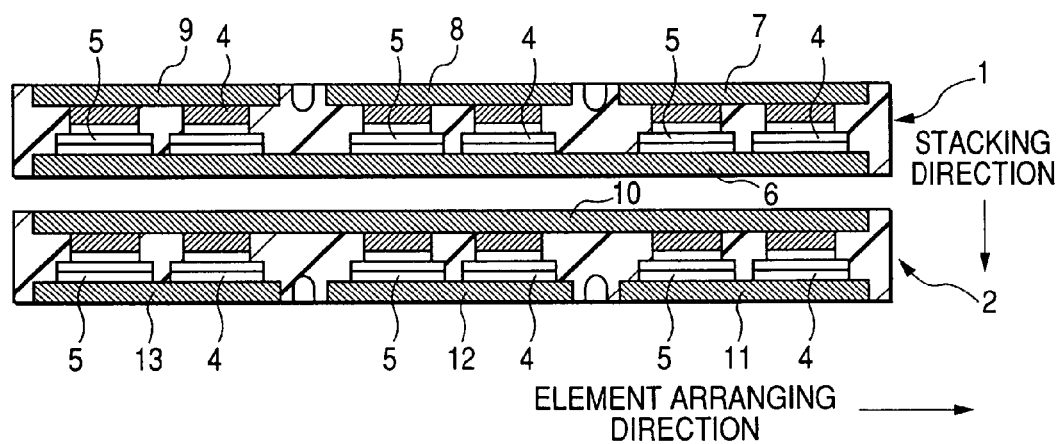
FIG. 15 is a transverse sectional view of the modules taken along the same plane as that in FIG. 14, as another example.

FIG. 14 is a transverse sectional view of the modules 1 and 2 taken along a plane substantially perpendicular to a vertical direction according to the second modification, and FIG. 15 is a transverse sectional view of the modules 1 and 2 taken along the same plane as that in FIG. 14, as another example. As shown in FIG. 14, the modules 1 and 2 are placed at a predetermined interval along the stacking direction such that the plates 7 to 9 of the module 1 face the plates 11 to 13 of the module 2, respectively. Further, as shown in FIG. 15, the modules 1 and 2 may be placed along the stacking direction such that the plates 6 and 10 of the modules 1 and 2 face each other, or the modules 1 and 2 may be placed such that one of the plate 6 and the group of plates 7 to 9 faces one of the plate 10 and the group of plates 11 to 13.

Modification 3

Figure 16:
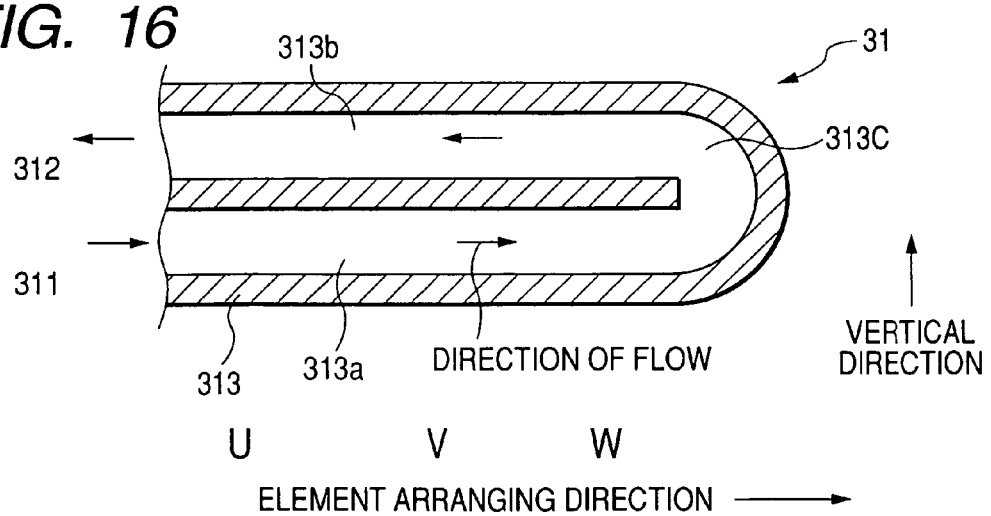
FIG. 16 is a sectional view schematically showing an intermediate cooling member according to a third modification.

FIG. 16 is a sectional view schematically showing the intermediate cooling member 31 according to a third modification. As shown in FIG. 16, the member 31 has a cooling fluid channel 313 extending in a U shape, the inlet 311, and the outlet 312. The channel 313 has a pair of straight portions 313*a* and 313*b* and a turning portion 313*c* connecting the portions 313*a* and 313*b*. The portions 313*a* and 313*b* extend along the arranging direction and disposed in parallel to each other along the vertical direction. The inlet 311 and outlet 312 are disposed at ends of the portions 313*b* and 313*c* near the U-phase elements 3 along the arranging direction. Further, pipes (not shown) extending from an external cooling unit or radiator (not shown) are, respectively, connected with the inlet 311 and outlet 312 to supply and receive cooling fluid to/from the channel 313 of the member 31.

The cooling fluid entered into the channel 313 from the inlet 311 flows through the portion 313*a* while cooling the modules 1 and 2, and a flowing direction of the fluid is changed in the turning portion 313*c*. Then, the fluid flows through the portion 313*b* while again cooling the modules 1 and 2 and is outputted from the outlet 312.

Because the inlet 311 and outlet 312 are adjacent to each other, the structure of the pipes connecting the cooling unit and the member 31 can be simplified. Further, the cooling fluid receives heat generated in each element 3 of the modules 1 and 2 twice such that heat generated in the U-phase elements 3 is absorbed by the fluid of the lowest temperature and the fluid of the highest temperature. Accordingly, temperatures of the plates 6 to 9 and 10 to 13 can be effectively equalized with one another, and the modules 1 and 2 can be efficiently cooled.

Preferably, the chips 4 and 5 are disposed as shown in FIG. 5 to place the chips 4 nearer to the portion 313*a* and to place the chips 5 nearer to the portion 313*b*. Because the chips 4 generating a larger amount of heat are placed nearer to the portion 313*a*, heat generated in the chips 4 can be efficiently absorbed by the cooling fluid of the lower temperature, and heat generated in the chips 5 can be efficiently absorbed by the cooling fluid of the higher temperature.

Each of the members 32 and 33 may have a U-shaped channel in the same manner as the member 31. Further, each of the members 31 to 33 may have a plurality of channels of an even number such that cooling fluid flows through the channels one by one while changing a flowing direction after flowing through each channel.

Modification 4

Figure 17:
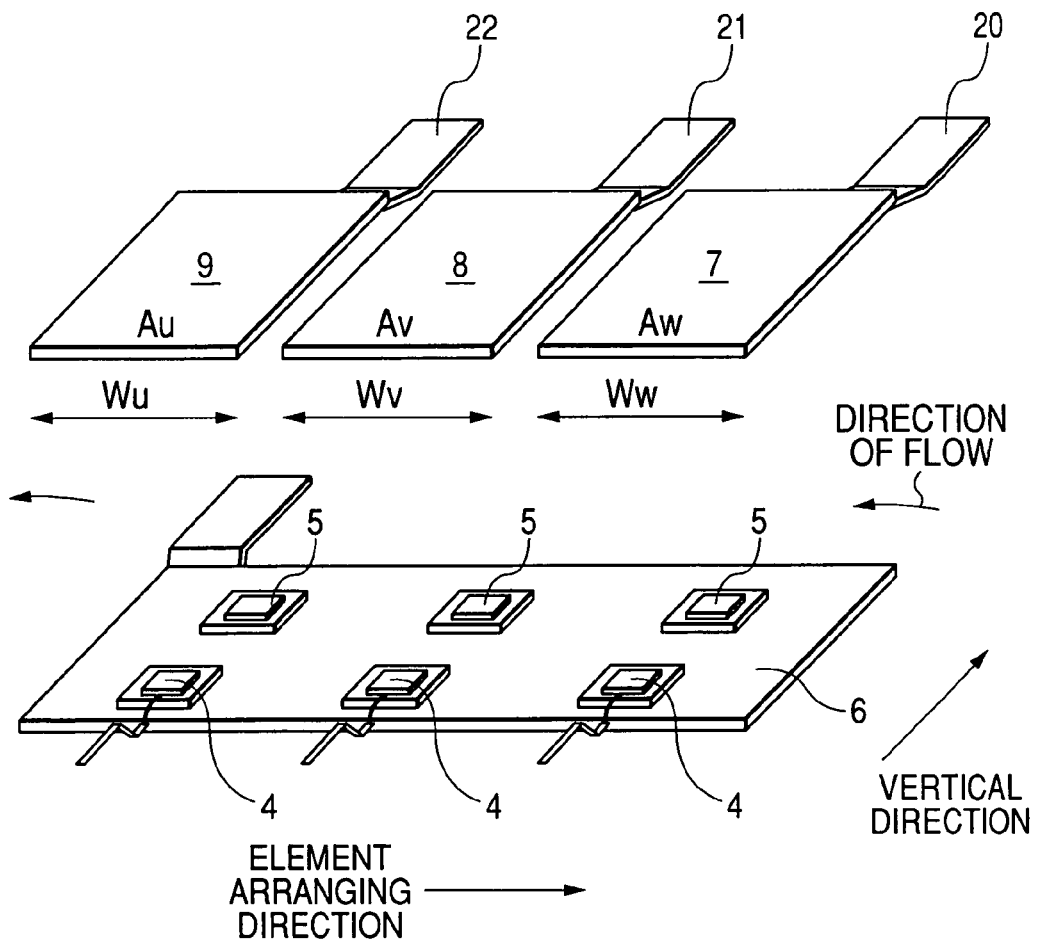
FIG. 17 is an exploded view of the module 1 according to a fourth modification.

FIG. 17 is an exploded view of the module 1 according to a fourth modification. As shown in FIG. 17, when the cooling fluid flows through the member 31 along a direction opposite to the arranging direction from the side of the W-phase chips 4 and 5 to the side of the U-phase chips 4 and 5, widths Ww, Wv and Wu of the plates 7, 8 and 9 are set to satisfy the relation Wu>Wv>Ww. That is, areas Aw, Av and Au of surfaces of the plates 7, 8 and 9 facing the chips 4 and 5 are set to satisfy the relation Au>Av>Aw.

The temperature of the cooling fluid flowing through the member 31 along the arranging direction is gradually increased while receiving heat from the chips 4 and 5. In case of the embodiment shown in FIG. 5, because widths of the plates 7 to 9 along the arranging direction are the same as one another, there is a probability that heat transferred from the plate 9 to the cooling fluid becomes lower than heat transferred from the plate 7 or 8 to the cooling fluid. In contrast, in this modification, the widths and areas of the plates 7, 8 and 9 are adjusted such that difference in the areas cancels out unbalance in the temperatures of the cooling fluid for the plates, so that amounts of heat transferred from the plates 7 to 9 to the cooling fluid can become the same as one another.

Accordingly, temperatures of the plates 7 to 9 cooled by the cooling fluid can be effectively equalized, and heat of the chips 4 and 5 can be efficiently dissipated to the atmosphere. Further, when a total width of the plates 7 to 9 is set to be the same as that shown in FIG. 5, the length of the module 1 along the arranging direction can be set to the same value as that shown in FIG. 5.

The widths of the plates 11 to 13 of the module 2 may be set in the same manner as in the module 1.

Modification 5

Figure 18:
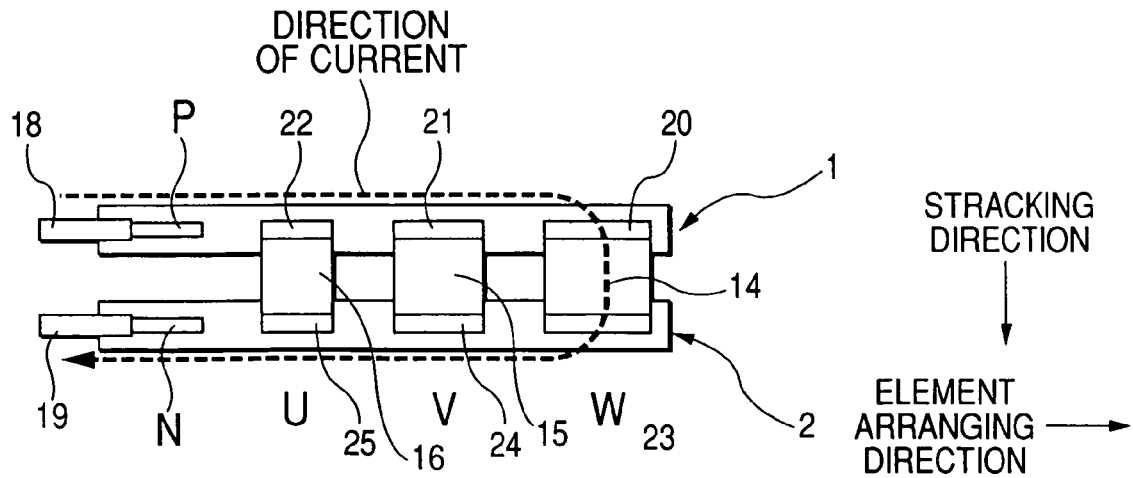
FIG. 18 is a top view schematically showing connection of terminals of the modules with bus bars according to a fifth modification.

FIG. 18 is a top view schematically showing connection of terminals of the modules with bus bars according to a fifth modification. As shown in FIG. 18, the terminals P and N are placed to be nearest to the U-phase area and to be furthest from the W-phase area. Therefore, a path length Lu of the U-phase current, a path length Lv of the V-phase current and a path length Lw of the W-phase current set between the terminals P and N satisfy the relation Lu<Lv<Lw. In this case, a width TWu of the terminals 22 and 25, a width TWv of the terminals 21 and 24 and a width TWw of the terminals 20 and 23 along the arranging direction are set to satisfy the relation TWu<TWv<TWw. A width of each of the bus bars 14 to 16 is, for example, set to be the same as that of the corresponding terminals.

In the embodiment shown in FIG. 4, widths of the terminals 20 to 22 and 23 to 25 and the widths of the bus bars 14 to 16 are set to be the same as one another. Therefore, because of the difference in the path lengths, electric resistances of the plates 6 to 13 for the phase currents differ from one another, and degrees of decrease of three phase voltages caused in the phase currents differ from one another. In this case, there is a probability that the motor receiving the different phase voltages cannot be smoothly driven.

In contrast, in this modification, as the path length of the phase current is lengthened, the width of the connecting terminals and bus bar for the phase current is widen to lower an electric resistance of the connecting terminals and bus bar for the phase current. Therefore, the lowering of the electric resistance of the connecting terminals and bus bar for each phase current cancels out the increase of the electric resistances of the plates 6 to 13 for the phase current so as to equalize electric resistances and wiring inductances between the terminals P and N for the phase currents with one another. Accordingly, the phase voltages applied to the motor can be reliably equalized with one another.

Modification 6

Figure 19:
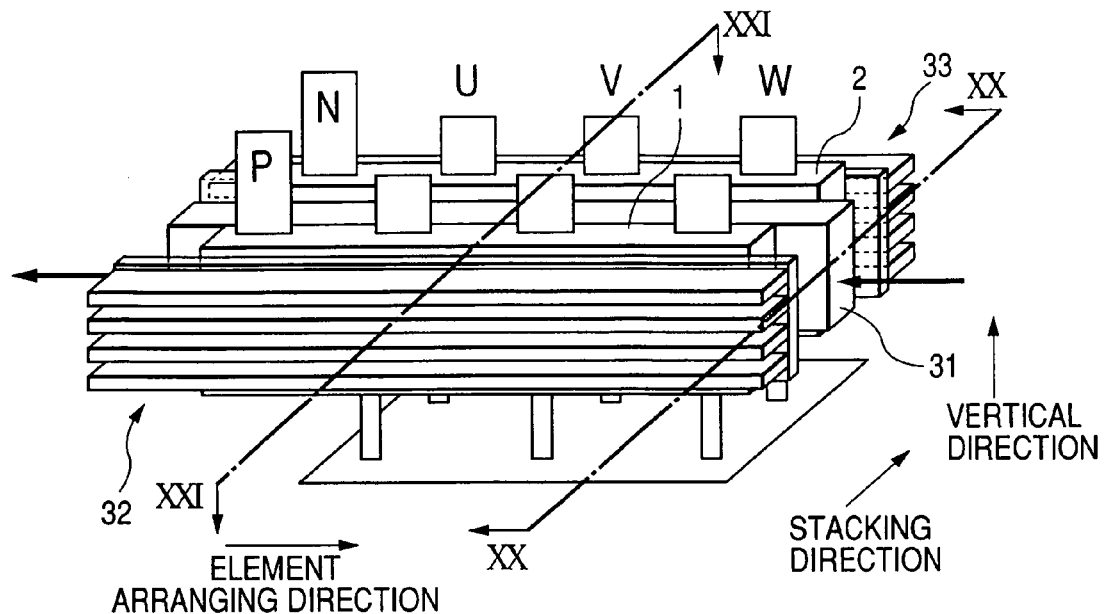
FIG. 19 is a perspective side view of an inverter according to a sixth modification.
Figure 20:
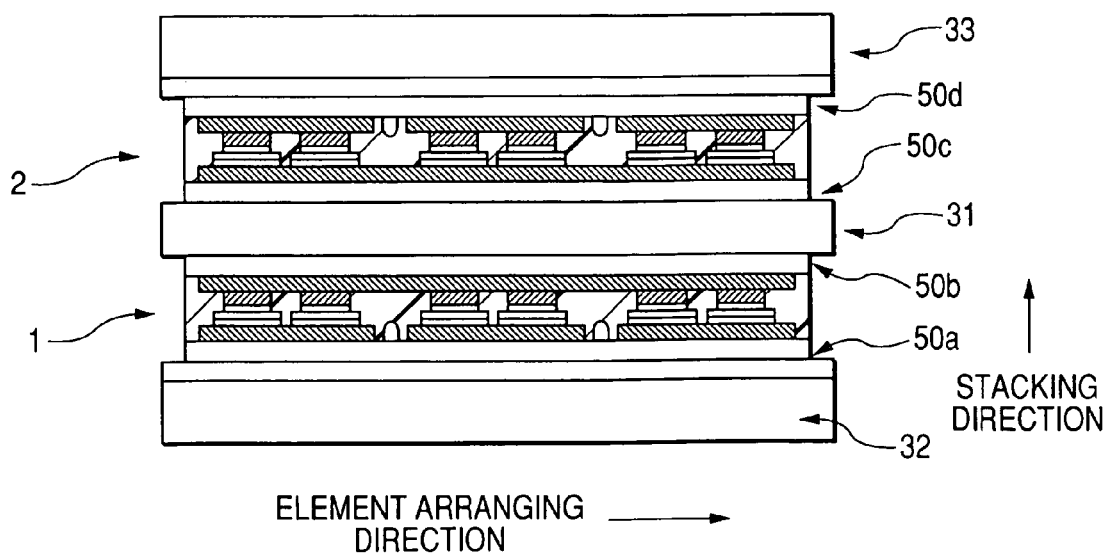
FIG. 20 is a transverse sectional view taken along line XX-XX of FIG. 19.
Figure 21:
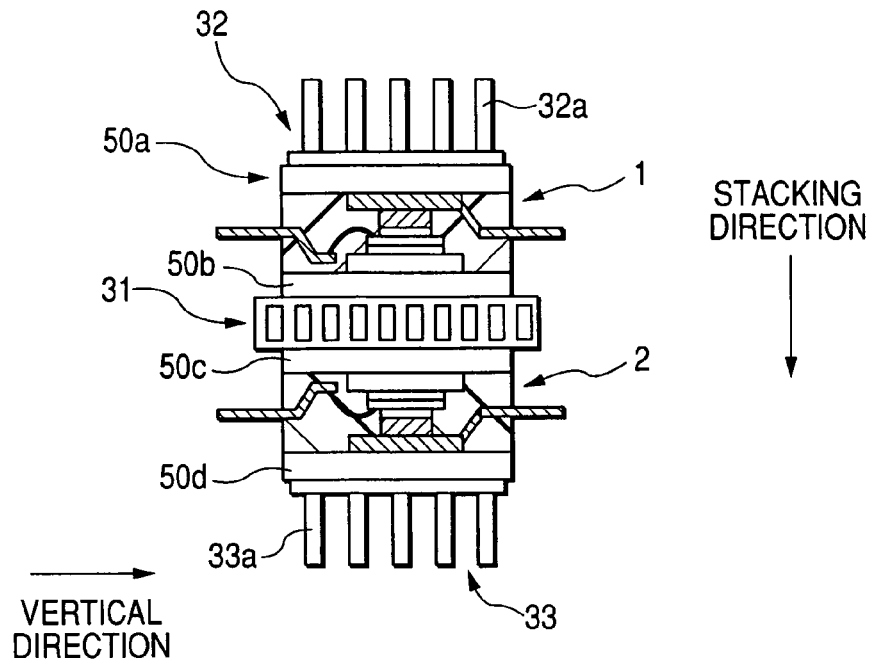
FIG. 21 is a longitudinal sectional view taken along line XXI-XXI of FIG. 19.

FIG. 19 is a perspective side view of an inverter according to a sixth modification, FIG. 20 is a transverse sectional view taken along line XX-XX of FIG. 19, and FIG. 21 is a longitudinal sectional view taken along line XXI-XXI of FIG. 19.

As shown in FIGS. 19 to 21, the inverter has the cooling member 32, an insulating sheet 50*a*, the module 1, an insulating sheet 50*b*, the cooling member 31, an insulating sheet 50*c*, the module 2, an insulating sheet 50*d* and the cooling member 33 stacked along the stacking direction in that order. Each of the members 32 and 33 has a plurality of cooling fins 32*a* or 33*a* disposed at predetermined intervals along the vertical direction to be formed in a cooling fin structure. Each fin is made of a metallic plate of a rectangular shape. The member 31 has cooling fluid channels extending along the arranging direction and being disposed in parallel to one another along the vertical direction, and a cooling fluid flows through the channels.

A wind obtained by the running of the vehicle or a wind forcibly generated by a fan (not shown) flows through a cooling space between fins 32*a* or 33*a* in each pair along the arranging direction. Accordingly, heat generated in the modules 1 and 3 can be effectively radiated from the members 32 and 33. Further, because no external cooling unit with pipes is required for the members 32 and 33, a cooling system for the inverter can be simplified.

Further, because the insulating sheets 50*b* and 50*c* are disposed between the member 31 and the modules 1 and 2 in the same manner as in the embodiment, the phase plates 7 to 9 and 11 to 13 of the modules can be attached to the member 31 through the sheets 50*b* and 50*c*. Accordingly, the distance between the phase plates of each phase can be shortened, and wiring resistance and inductance of the bus bar connecting the phase plates of each phase can be preferably reduced. Further, the common plates 6 and 10 can be attached to the member 31 through the sheets 50*b* and 50*c*. Accordingly, even though the phase plates aligned along the arranging direction have different lengths along the vertical direction, the attachment of one phase plates having a shorter length with the common plate facing the phase plate can be maintained.

Modification 7

Figure 22:
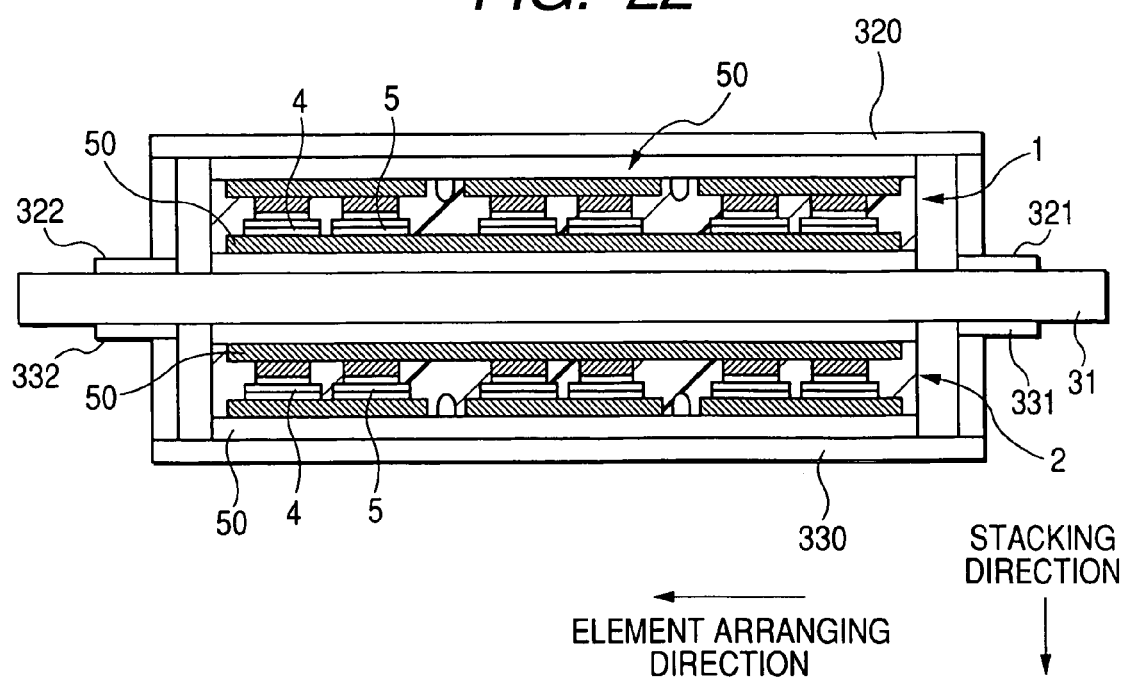
FIG. 22 is a transverse sectional view of an inverter taken along a plane substantially perpendicular to the vertical directions according to a seventh modification.

FIG. 22 is a transverse sectional view of an inverter taken along a plane substantially perpendicular to the vertical directions according to a seventh modification. The inverter has a pair of heat receiving members 320 and 330 in place of the members 32 and 33. Each of the members 320 and 330 is made of metallic material such as aluminium alloy and is formed in a U shape in section so as to surround the corresponding module. The member 320 has a center portion attached to one principal surface of the module 1 through the insulating sheet 50*a*, two end portions 321 and 322 connected with the member 31 and two side portions connecting the center portion with the end portions 321 and 322. The member 330 has a center portion attached to one principal surface of the module 2 through the insulating sheet 50*d*, two end portions 331 and 332 connected with the member 31 and two side portions connecting the center portion with the end portions 331 and 332.

Heat generated in the module 1 is received in the center portion of the member 320 and is transferred to the member 31 through the end portions 321 and 322. Heat generated in the module 2 is received in the center portion of the member 330 and is transferred to the member 31 through the end portions 331 and 332. Then, the heat transferred to the member 31 is dissipated to the atmosphere by the cooling fluid of the member 31.

A quantity of heat required to be received in the member 320 and a quantity of heat required to be received in the member 330 are smaller than that required to be received in the member 31. Accordingly, although each of the members 320 and 330 has no cooling fluid, the heat received in the members 320 and 330 can be smoothly transferred to the cooling fluid.

Preferably, each of the members 320 and 330 has fluid channels each extending between the end portions thereof. A portion of cooling fluid of the member 31 is entered into the channels of the members 320 and 330 from the end portions 321 and 331 and is outputted to the member 31 from the end portions 322 and 332. Accordingly, the members 320 and 330 can effectively transfer the heat of the modules to the cooling liquid of the member 31.

Modification 8

Figure 23:
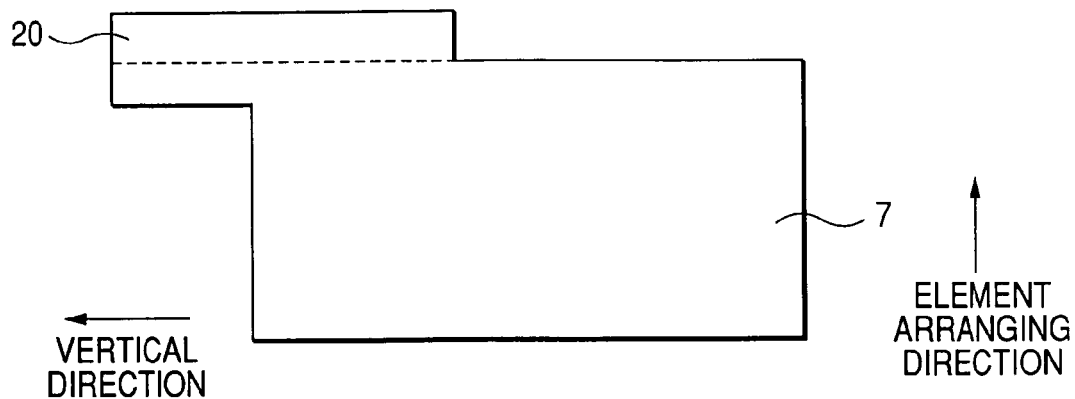
FIG. 23 is a view showing attachment of a terminal to a plate according to an eighth modification.
Figure 24:
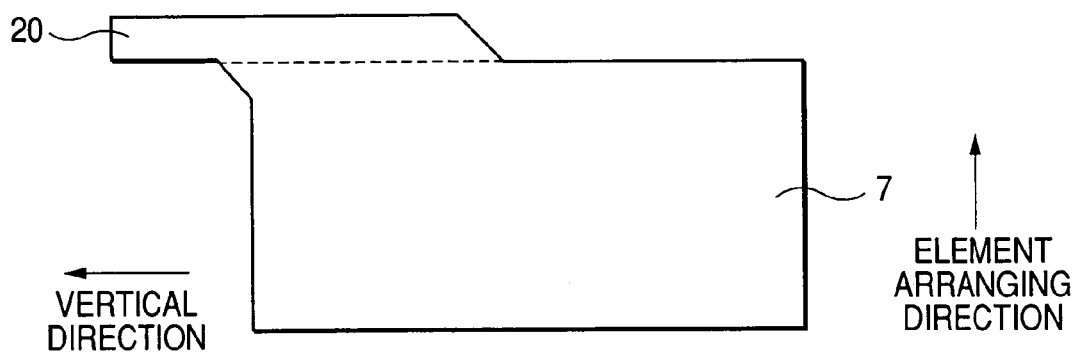
FIG. 24 is a view showing attachment of a terminal to a plate, as another example.

FIG. 23 is a view showing attachment of the terminal 20 to the plate 7 according to an eighth modification, and FIG. 24 is a view showing attachment of the terminal 20 to the plate 7, as another example.

In the embodiment shown in FIG. 5, the terminals 20 to 22 and 23 to 25 and the terminals P and N are integrally formed with the plates 7 to 9, 11 to 13, 6 and 10 by press working, respectively. In contrast, as shown in FIGS. 23 and 24, the terminal 20 may be formed separately from the plate 7 and be attached to the plate 7. The other terminals may be formed in the same manner.

Modification 9

Figure 25:
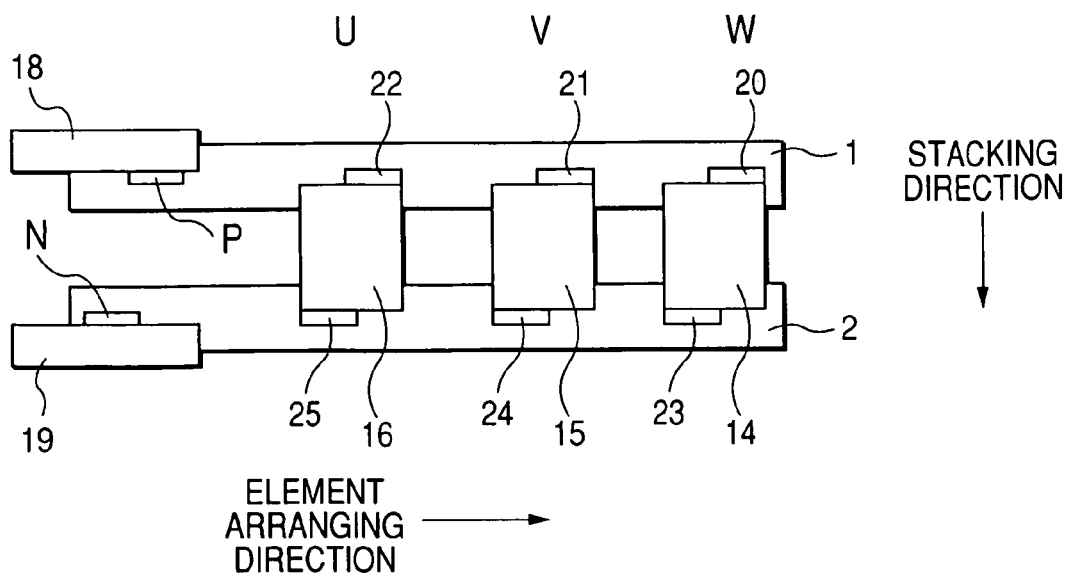
FIG. 25 is a top view showing connection of terminals of the modules with bus bars according to a ninth modification.

FIG. 25 is a top view showing connection of the terminals of the modules 1 and 2 with bus bars according to a ninth modification. As shown in FIG. 25, the width of each terminal along the arranging direction may differ from that of the corresponding bus bar. In other words, on condition that the terminal is electrically connected with the bus bar, the bus bar is not required to be correctly positioned with respect to the terminal.

Further, in the embodiment shown in FIG. 4, an end portion of each of the terminals P and N is attached to a side end portion of the corresponding bus bar. However, as shown in FIG. 25, a larger surface of the terminal may be attached to a larger surface of the bus bar.

What is claimed is:

1. A multiphase inverter, comprising:
    a first arm module which is formed in a card shape,
    the first arm module comprising:
        a plurality of first current converting elements which are disposed along a first direction, each first current converting element having a direct current electrode and an alternating current electrode a plurality of phase currents of a multiphase alternating current, respectively, flowing through the first current converting elements;
        a first common heat sink plate which electrically connects the direct current electrodes of the first current converting elements with a higher voltage terminal of a power source and forms a principal surface of the first arm module;
        a plurality of first phase heat sink plates which, respectively, connect the alternating current electrodes of the first current converting elements with a plurality of multiphase terminals of an alternating current motor and forms another principal surface of the first arm module;
        a plurality of first phase connecting terminals which, respectively, extend from the first phase heat sink plates toward a second direction substantially perpendicular to the first direction so as to protrude from the first phase heat sink plates, the first phase connecting terminals being, respectively, connected with the terminals of the motor; and
        a first common connecting terminal which is connected with the higher voltage terminal of the power source and extends from the first common heat sink plate toward the second direction so as to protrude from the first common heat sink plate;
    a second arm module which is formed in a card shape,
    the second arm module comprising:
        a plurality of second current converting elements which are disposed along the first direction, each second current converting element having a direct current electrode and an alternating current electrode, wherein the phase currents of the multiphase alternating current. respectively, flow through the second current converting elements, and wherein the order of a plurality of phases of the multiphase alternating current at the second current converting elements along the first direction is the same as the order of the phases of the multiphase alternating current at the first current converting elements;
        a second common heat sink plate which electrically connects the direct current electrodes of the second current converting elements with a lower voltage terminal of the power source and forms a principal surface of the second arm module;
        a plurality of second phase heat sink plates which, respectively, connect the alternating current electrodes of the second current converting elements with the multiphase terminals of the motor and forms another principal surface of the second arm module;
        a plurality of second phase connecting terminals which, respectively, extend from the second phase heat sink plates toward the second direction so as to protrude from the second phase heat sink plates, the second phase connecting terminals being, respectively, connected with the terminals of the motor; and
        a second common connecting terminal which is connected with the lower voltage terminal of the power source and extends from the second common heat sink plate toward the second direction so as to protrude from the second common heat sink plate, the second common connecting terminal being placed substantially at the same position as the first common connecting terminal along the first direction; and
    an intermediate cooling member with a cooling fluid channel which is disposed between the first and second arm modules, the cooling fluid channel extending along the first direction, a cooling fluid of the cooling fluid channel receiving heat generated in the first and second arm modules through the principal surfaces of the first and second arm modules facing each other;
    wherein each of the common connecting terminals extends from an end portion of the corresponding common heat sink plate placed at one end side along the first direction to be away from the phase connecting terminals of the phase heat sink plates of the corresponding arm module in the first direction.

2. The inverter according to claim 1, wherein each pair of the connecting terminals extended from the heat sink plates corresponding to one pair of first and second current converting elements are placed substantially at the same position as each other along the first direction.

3. The inverter according to claim 2, wherein the first current converting elements are aligned with one another along the first direction, and the second current converting elements are aligned with one another along the first direction.

4. The inverter according to claim 1, wherein each of the first and second current converting elements has a flywheel diode and a power transistor aligned along the second direction.

5. The inverter according to claim 4, wherein the power transistor is placed to be nearer to the corresponding connecting terminal than the flywheel diode, in each of the current converting elements.

6. The inverter according to claim 2, wherein a distance between a center position of the power transistor and a center position of the corresponding phase heat sink plate along the second direction is smaller than a distance between a center position of the flywheel diode and the center position of the phase heat sink plate along the second direction, in each of the current converting elements.

7. The inverter according to claim 2, wherein the flywheel diode is placed to be nearer to the corresponding connecting terminal than the power transistor, in each of the current converting elements.

8. The inverter according to claim 7, further comprising:
an intermediate cooling member which is disposed between the first and second arm modules and has a cooling fluid channel including a first cooling portion and a second cooling portion,
wherein the first cooling portion extends along the first direction so as to be placed adjacent to the power transistors of the arm modules, the second cooling portion extends along the first direction so as to be placed adjacent to the flywheel diodes of the arm modules, and a cooling fluid is entered into the cooling fluid channel of the intermediate cooling member and flows through the first cooling portion and the second cooling portion in that order.

9. The inverter according to claim 1, wherein each of the first and second current converting elements has a flywheel diode and a power transistor aligned along the first direction such that the power transistor is placed to be nearer to the corresponding connecting terminal than the flywheel diode.

10. The inverter according to claim 1, wherein each phase connecting terminal placed nearer to the common connecting terminals than other ones of the phase connecting terminals has a width along the first direction narrower than those of the other ones.

11. The inverter according to claim 1, further comprising a phase current bus bar connected with one pair of phase connecting terminals corresponding to each phase,
wherein the terminal of the motor corresponding to each phase is connected with the phase current bus bar corresponding to the phase, and each phase current bus bar connected with the phase connecting terminals placed nearer to the common connecting terminals than other ones of the phase connecting terminals has a width along the first direction narrower than widths of other phase current bus bars or a width of another phase current bus bar connected with the other ones.

12. The inverter according to claim 1, wherein the cooling fluid flows from a first portion of the cooling fluid channel of the intermediate cooling member placed on a first end side along the first direction to a second portion of the channel placed on a second end side opposite to the first end side along the first direction, and
wherein each phase heat sink plate placed nearer to the second portion of the channel than other ones or another one of the phase heat sink plates has a width along the first direction wider than those of the other ones or that of the another one.

13. The inverter according to claim 1, further comprising:
a control signal bus bar which extends from each of the first and second current converting elements toward a direction opposite to the second direction; and
a control circuit which generates a control signal for each of the first and second current converting elements and transmits the control signals to the first and second current converting elements through the control signal bus bars, respectively.

14. The inverter according to claim 1, further comprising:
a first arm cooling member which is attached to one of the principal surfaces of the first arm module and radiates heat generated in the first current converting elements through the principal surface of the first arm module; and
a second arm cooling member which is attached to one of the principal surfaces of the second arm module and radiates heat generated in the second current converting elements through the principal surface of the second arm module.

15. The inverter according to claim 14,
wherein the cooling fluid flows from a first end portion of the cooling fluid channel of the intermediate cooling member placed on a first side along the first direction to a second end portion of the channel placed on a second side opposite to the first side along the first direction, and
wherein each of the first and second arm cooling members has a first heat transfer portion attached to the first end portion of the channel and a second heat transfer portion attached to the second end portion of the channel such that the heat received in each of the arm cooling members is transferred to the cooling fluid through the first and second heat transfer portions.

16. The inverter according to claim 15, wherein each of the first and second arm cooling members has a cooling fluid channel through which a portion of the cooling fluid flows from the first heat transfer portion to the second heat transfer portion.

17. The inverter according to claim 14, wherein each of the first and second arm cooling members has a plurality of cooling fines disposed in parallel to one another along the second direction.

18. The inverter according to claim 14, further comprising:
a first insulating member for insulating the first arm module from the first arm cooling member;
a second insulating member for insulating the first arm module from the intermediate cooling member;
a third insulating member for insulating the second arm module from the intermediate cooling member; and
a fourth insulating member for insulating the second arm module from the second arm cooling member.

19. The inverter according to claim 1, wherein the first current converting elements generate a multiphase alternating current from a direct current of the power source in cooperation with the second current converting elements.

20. The inverter according to claim 1, wherein the principal surfaces of the first arm module face each other along a stacking direction substantially perpendicular to the first and second directions, and the principal surfaces of the second arm module face each other along the stacking direction.

21. The inverter according to claim 1, wherein the first and second arm modules and the intermediate cooling member are layered along a third direction substantially perpendicular to the first and second directions to be aligned with one another.

22. The inverter according to claim 1, wherein the phase connecting terminals and the common connecting terminals of the first and second arm modules are placed at the same side in the second direction.

23. The inverter according to claim 1, wherein the intermediate cooling member has an inlet and an outlet each of which is disposed at an end of the cooling fluid channel in the first direction, the cooling fluid enters into the cooling fluid channel from the inlet, and the cooling fluid of the cooling fluid channel is outputted from the outlet.

24. The inverter according to claim 1, wherein the common connecting terminals are disposed to face each other along a third direction substantially perpendicular to the first and second directions.

25. The inverter according to claim 1, wherein the common connecting terminals and the phase connecting terminals are placed substantially at the same position in the second direction.

* * * * *

UNITED STATES PATENT AND TRADEMARK OFFICE
CERTIFICATE OF CORRECTION

| | | |
|---|---|---|
| PATENT NO. | : 7,633,758 B2 | Page 1 of 1 |
| APPLICATION NO. | : 11/471618 | |
| DATED | : December 15, 2009 | |
| INVENTOR(S) | : Kenichi Oohama | |

It is certified that error appears in the above-identified patent and that said Letters Patent is hereby corrected as shown below:

Col. 16, line 64-Col. 17, line 3, claim 6 should read 6. The inverter according to claim 4, wherein a distance between a center position of the power transistor and a center position of the corresponding phase heat sink plate along the second direction is smaller than a distance between a center position of the flywheel diode and the center position of the phase heat sink plate along the second direction, in each of the current converting elements.

Col. 17, lines 4-7, claim 7 should read 7. The inverter according to claim [[2]]4, wherein the flywheel diode is placed to be nearer to the corresponding connecting terminal than the power transistor, in each of the current converting elements.

This certificate supersedes the Certificate of Correction issued March 2, 2010.

Signed and Sealed this

Thirtieth Day of March, 2010

David J. Kappos
*Director of the United States Patent and Trademark Office*